United States Patent [19]

Kitagawa et al.

[11] Patent Number: 5,028,974
[45] Date of Patent: Jul. 2, 1991

[54] SEMICONDUCTOR SWITCHING DEVICE WITH ANODE SHORTENING STRUCTURE

[75] Inventors: Mituhiko Kitagawa, Tokyo; Tsuneo Ogura, Kamakura; Hiromichi Ohashi, Yokohama; Yoshinari Uetake, Sagamihara; Yoshio Yokota, Tokyo; Kazuo Watanuki, Yokohama, all of Japan

[73] Assignee: Kabushiki Kaisha Toshiba, Kawasaki, Japan

[21] Appl. No.: 474,238

[22] Filed: Feb. 5, 1990

Related U.S. Applications Data

[63] Continuation of Ser. No. 126,932, Nov. 30, 1987.

[30] Foreign Application Priority Data

Dec. 1, 1986 [JP] Japan .................................. 61-286408
Jan. 29, 1987 [JP] Japan .................................. 62-18934
Oct. 6, 1987 [JP] Japan .................................. 62-252113

[51] Int. Cl.5 .............................................. H01L 29/74
[52] U.S. Cl. .......................................... 357/38; 357/39; 357/56; 357/86; 357/89
[58] Field of Search ...................... 357/38, 56, 86, 89, 357/39

[56] References Cited

U.S. PATENT DOCUMENTS

| | | | |
|---|---|---|---|
| 3,324,359 | 6/1967 | Gentry | 357/86 |
| 4,356,503 | 10/1982 | Shafer et al. | 357/38 |
| 4,443,810 | 4/1984 | Yatsuo et al. | 357/38 |
| 4,604,638 | 8/1986 | Matsuda | 357/38 |
| 4,617,583 | 10/1986 | Shinohe et al. | 357/89 |
| 4,689,647 | 8/1987 | Nakagawa et al. | 357/38 |
| 4,742,382 | 5/1988 | Jaecklin | 357/38 |
| 4,786,959 | 11/1988 | Shimizu et al. | 357/38 |

FOREIGN PATENT DOCUMENTS

| | | | |
|---|---|---|---|
| 0074133 | 3/1983 | European Pat. Off. | 357/38 G |
| 53-16584 | 2/1978 | Japan | 357/38 G |
| 51-159957 | 7/1978 | Japan | 357/39 P |
| 54-106176 | 8/1979 | Japan | 357/39 |
| 56-104467 | 8/1981 | Japan | 357/39 R |
| 59-9968 | 1/1984 | Japan | 357/36 G |
| 59-58865 | 4/1984 | Japan | 357/39 |
| 59-225567 | 12/1984 | Japan | 357/39 |

OTHER PUBLICATIONS

Extended Abstracts of the 19th Conference on Solid State Devices and Materials, Tokyo, "6000 V Gate Turn-Off Thyristor (GTO) with N-buffer and New Anode Short Structure", Aug. 25-27, 1987.

Primary Examiner—Rolf Hille
Assistant Examiner—Steven Loke
Attorney, Agent, or Firm—Finnegan, Henderson, Farabow, Garrett and Dunner

[57] ABSTRACT

A semiconductor switching device includes a high resistance first base layer of n-type formed on a first emitter layer of p-type through a low resistance buffer layer of $n^+$-type, second base layer of p-type formed on the first base layer, second emitter layers of $n^+$-type separately formed on the second base layer, anode and cathode main electrodes formed in contact with the first and second emitter layers, and a gate electrode formed in contact with the second base layer. Part of the low resistance buffer layer is exposed to the surface of the first emitter layer and is made contact with the anode main electrode to constitute a shorting portion. The width of the shorting portion is set smaller than one tenth of that of the second emitter layer in a longitudinal direction.

21 Claims, 24 Drawing Sheets

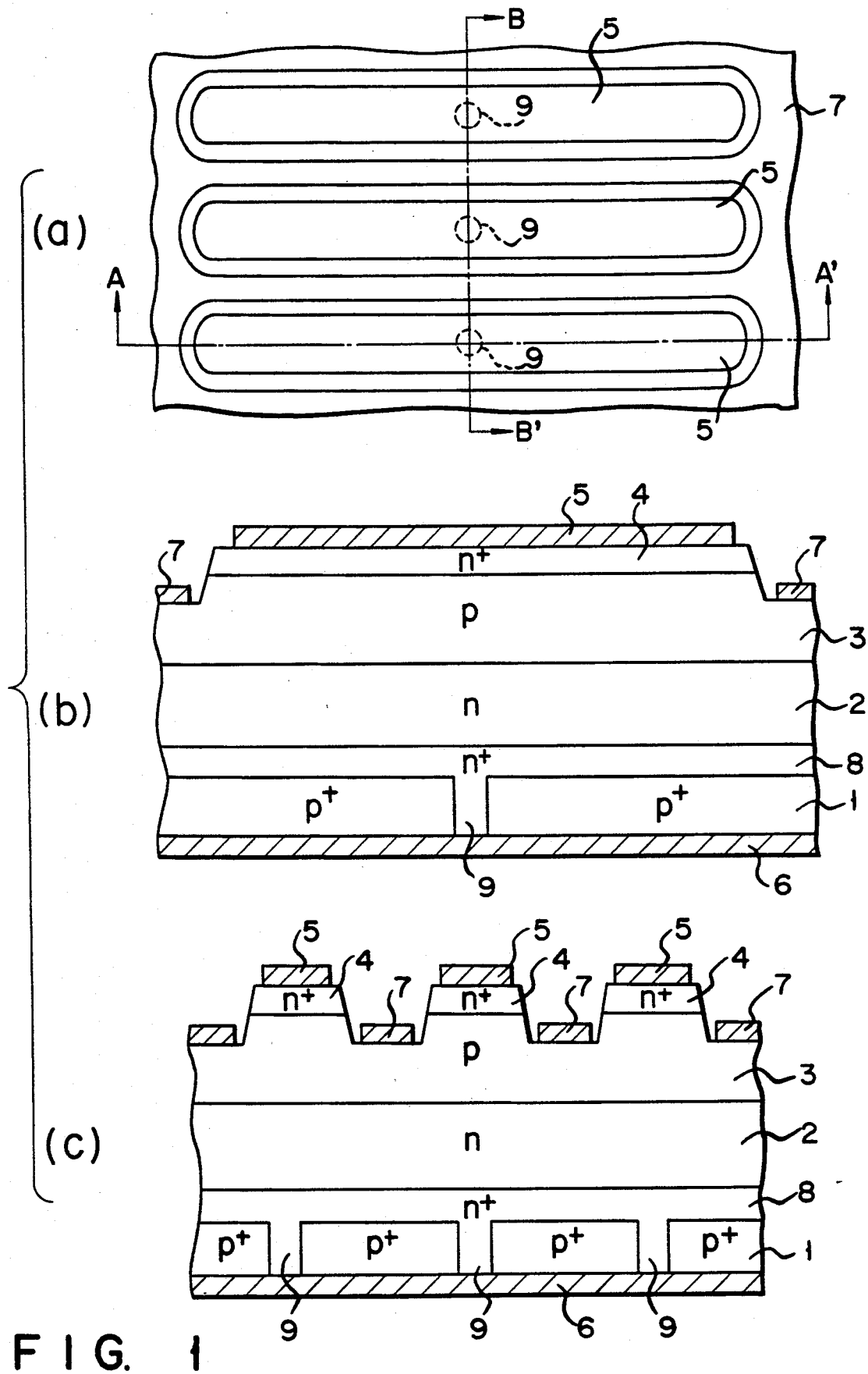
F I G. 1

| d \ ρs | K | |
|---|---|---|
| | 228 (Ω/□) | 975 (Ω/□) |
| 0.28 (cm) | 16.6 | 71.1 |
| 0.18 (cm) | 7.4 | 31.6 |
| 0.11 (cm) | 2.7 | 11.4 |
| 0.016 (cm) | 0.06 | 0.3 |

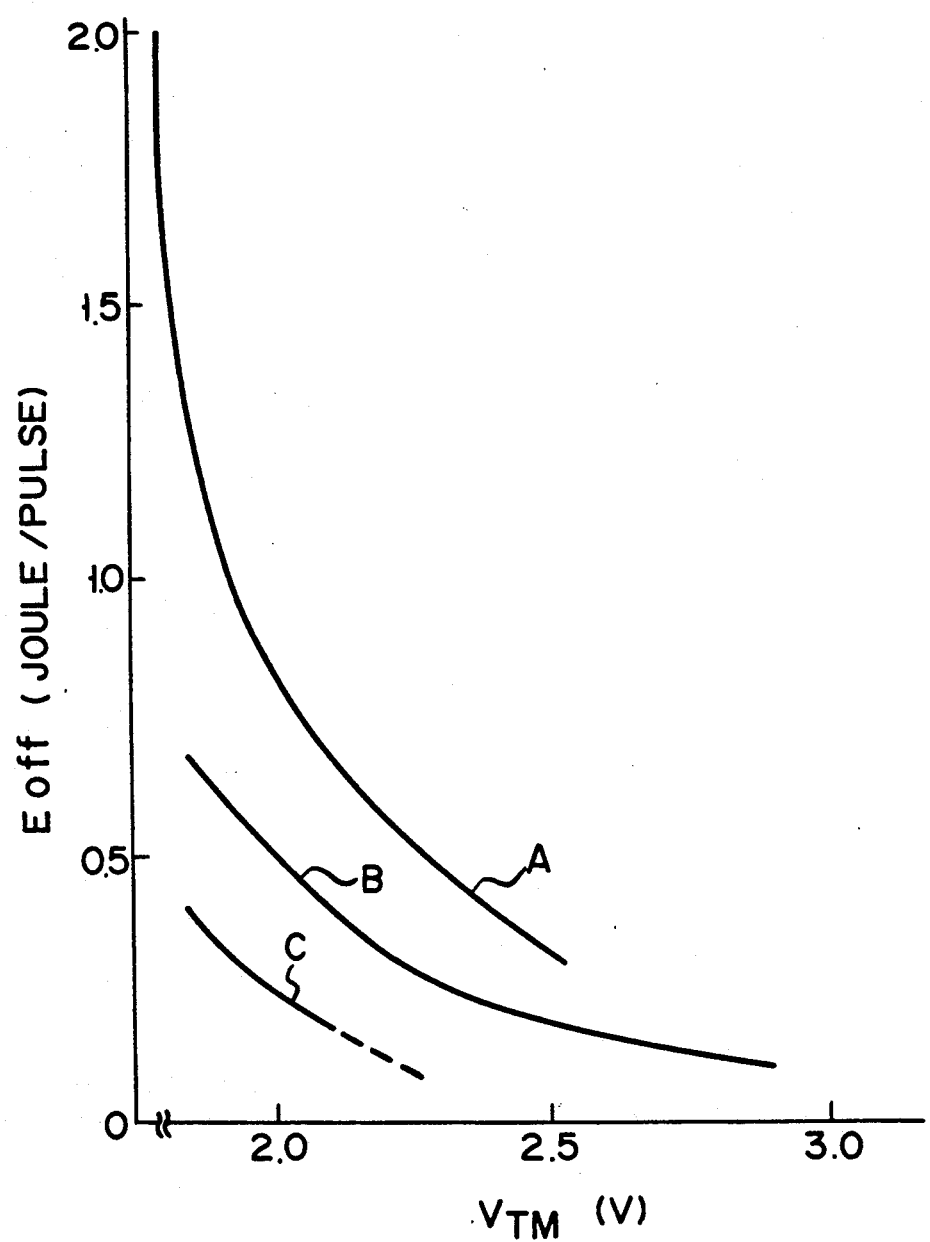
F I G. 14

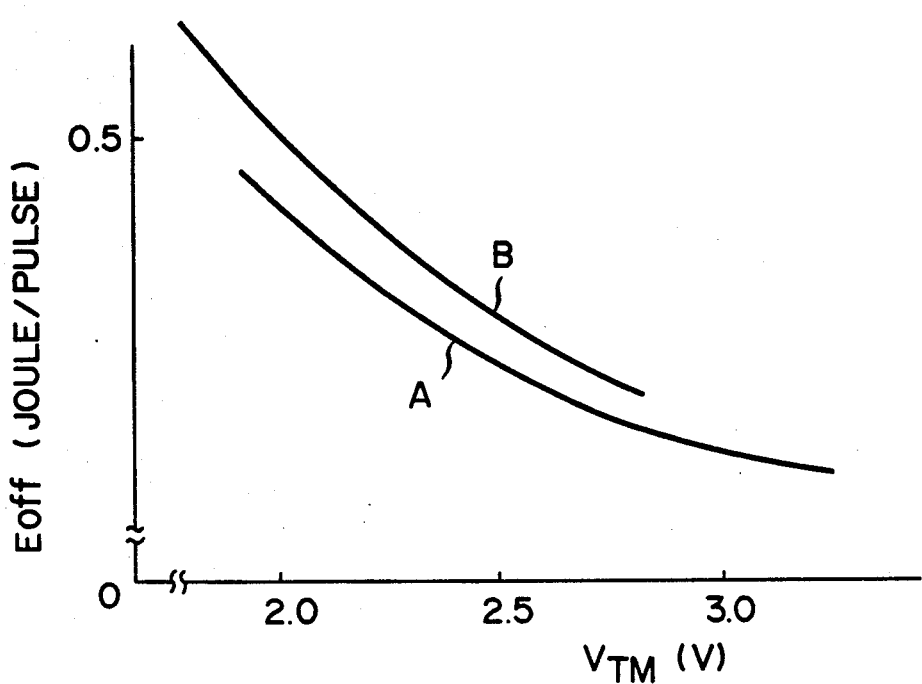
F I G. 16
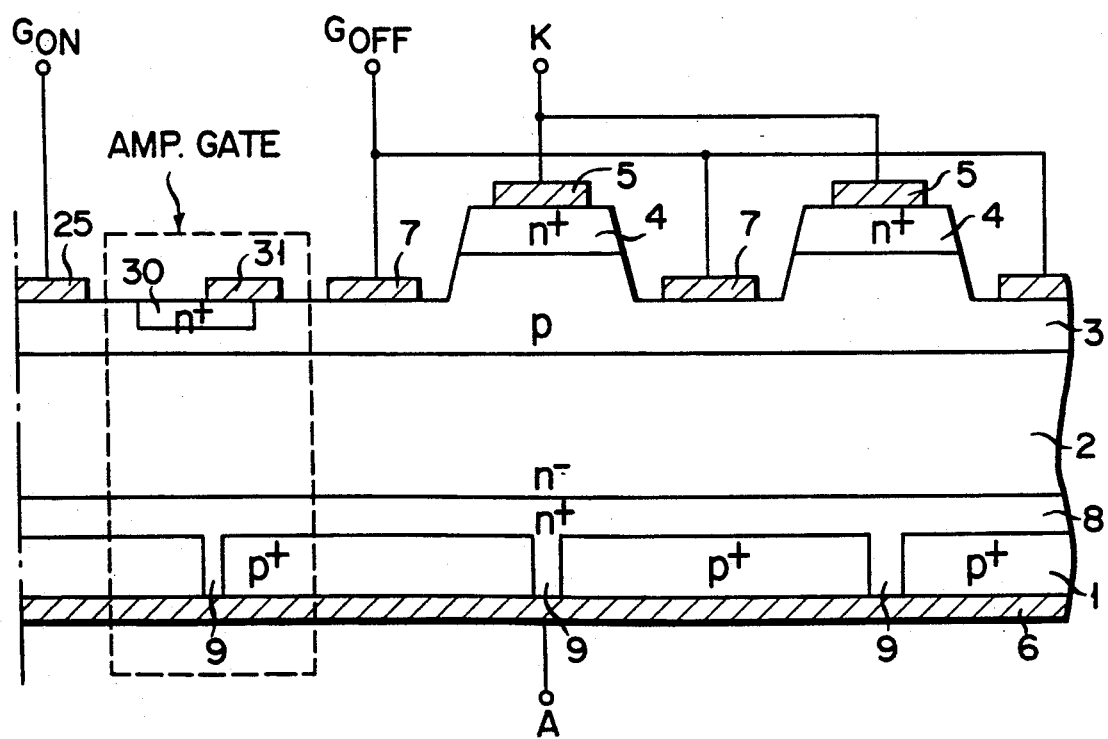
F I G. 19

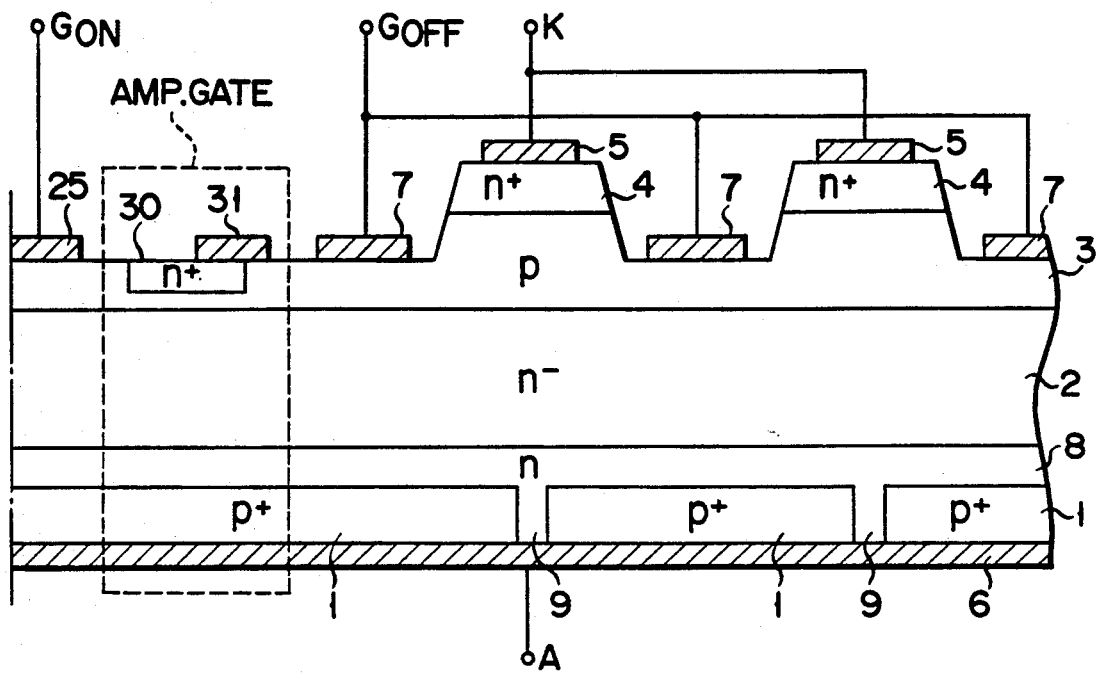
F I G. 18
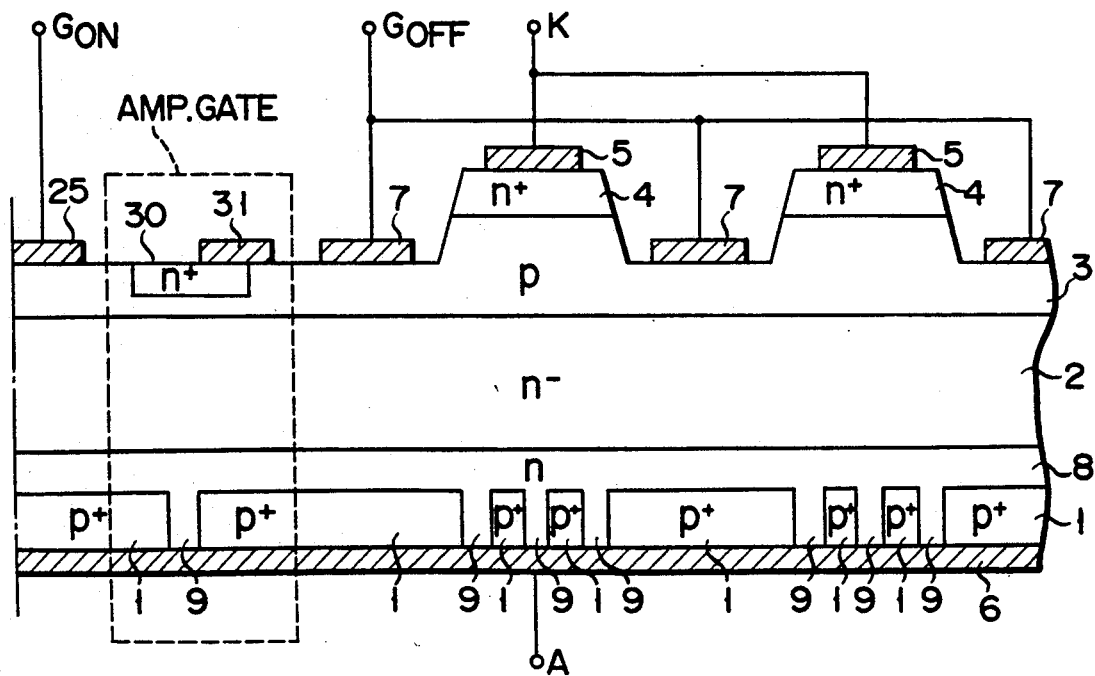
F I G. 20

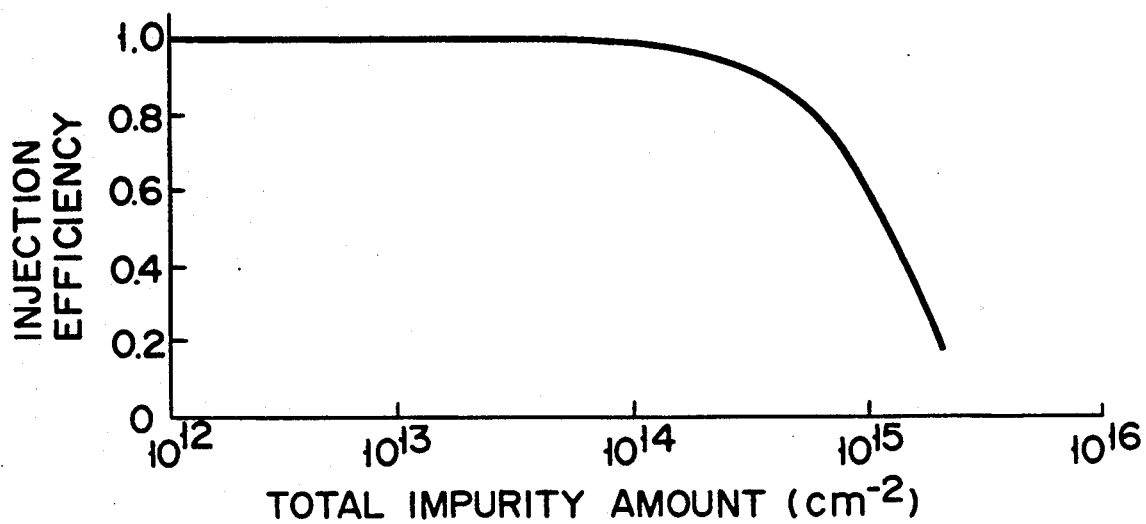
F I G. 28

SEMICONDUCTOR SWITCHING DEVICE WITH ANODE SHORTENING STRUCTURE

This application is a continuation, of U.S. application Ser. No. 07/126,932, filed Nov. 30, 1987.

BACKGROUND OF THE INVENTION

This invention relates to an improvement of a semiconductor switching device with anode shorting structure and particularly, to a gate turn-off thyristor (GTO) with anode shorting structure which has an enhanced gate trigger sensitivity and a reduced turn-off loss.

A gate turn-off thyristor or GTO can be turned off by applying a negative voltage to the gate electrode thereof to draw part of the anode current from the gate electrode. Time required for turning off the GTO, or the gate turn-off time, is a very important characteristic because it determines the upper limit of the operation frequency of an equipment utilizing the GTO. The gate turn-off time becomes long with increase in the diameter and thickness of a silicon wafer used to form a GTO of large electric power capacity.

In order to solve the above problem, a GTO of anode shorting structure is proposed, which has part of an n-type base layer formed in direct contact with the anode electrode (which is disclosed in, for example, Japanese Patent Publication No. 55-10143). FIGS. 33(a), (b) and (c) shows the construction of the GTO. FIG. 33(a) is a plan view of the GTO as viewed from the cathode side thereof, and FIGS. 33(b) and (c) are cross-sectional views of the GTO OF FIG. 33(a) taken along lines A—A' and B—B', respectively. The GTO has a pnpn structure comprising p+-type emitter layers (first emitter layer) 51, n⁻-type base layer (first base layer) 52, p-type base layer (second base layer) 53 and n+-type emitter layers (second emitter layer) 54 which are separately formed in long and narrow patterns. Anode electrode (first main electrode) 56, cathode electrodes (second main electrode) 55 and gate electrode 57 are respectively formed on the surfaces of p+-type emitter layers 51, n+-type layers 54 and an p-type base layer 53.

Those portions of n⁻-type base layer 52 which correspond in position to the cathode electrodes extend to anode electrode 56 to make a flat surface with p+-type emitter layers 51 and contact with anode electrode 56. The extending portions are used as shorting portions 58. Formation of shorting portions 58 makes it possible to effectively drive out carriers n⁻-type base layer 52 via anode electrode 56 at the turn-off time, thereby reducing the turn-off time.

FIGS. 34(a), (b) and (c) show an example in which n+-type buffer layer 59 with low resistivity is additionally formed to reduce the thickness of the GTO shown in FIGS. 33(a) to (c). This example is introduced in Japanese Patent Disclosure No. 56-6790. FIG. 34(a) is a plan view of the GTO as viewed from the cathode side thereof, and FIGS. 34(b) and (c) are cross-sectional views of the GTO of FIG. 34(a) taken along lines A—A' and B—B', respectively. Formation of n+-type buffer layer 59 with low resistivity permits the thickness of n⁻-type base layer 52 of high resistivity to be reduced, attaining a low turn-on voltage. The combination of n+-type buffer layer 59 with low resistivity and the anode shorting structure can further improve the turn-off characteristic.

However, the GTO with the anode shorting structure including the n+-type buffer layer as shown in FIGS. 34(a) to (c) has a problem that the gate trigger sensitivity is lowered. The problem is caused by the fact that resistance Rs of a shorting resistor connected between the base and emitter of a parasitic pnp transistor formed of the p-type emitter, n-type base and p-type base, as is shown in an equivalent circuit of FIG. 34(d), becomes too small due to the presence of n+-type buffer layer 59 with low resistivity.

In the GTO shown in FIGS. 33(a) to (c) or FIGS. 34(a) to (c), p-type base layer 53 and p+-type emitter layer 51 are simultaneously formed in the same impurity diffusion step to have the diffusion depth xj of, for example, 70 to 90 μm. The reason is as follows. The depth of n+-type emitter layer 54 is an important factor to determine the characteristics of the GTO and it is necessary to form p-type base layer 53 and p+-type emitter layer 51 to a certain diffusion depth in order to set the diffusion depth of n+-type emitter layer 54. The reason why p+-type emitter layer 51 is formed thick is that, in the prior art, a Mo layer or W layer is alloyed as a heat buffering plate with a silicon pellet. In this case, the alloy layer is formed as thick as 20 to 30 μm, at the time of formation of the alloy layer, a spike of aluminum electrode (56) may happen to be projected into the silicon pellet as deep as 60 μm. For this reason, it is desirable to form p+-type emitter layer 51 to a thickness of 70 to 90 μm.

In the case where p+-type emitter layer 51 is formed thick in the GTO shown in FIGS. 33(a) to (c), impurities are diffused in lateral directions when shorting portions 58 are formed by diffusion, making it impossible to reduce the size of shorting portions 58.

In the case where p+-type emitter layer 51 is formed thick in the GTO having n+-type buffer layer 59 of low resistivity as shown in FIGS. 34(a) to (c), it is practically impossible to form n+-type buffer layer 59 by diffusion. Therefore, in this case, it is necessary to n+-type buffer layer 59 by epitaxial growth technique. At this time, if defects are created in the step of epitaxial growth, the withstanding or breakdown voltage is lowered, resulting in lowering the yield.

As described above, in the GTO of the anode shorting structure having the n+-type buffer layer, the gate turn-off time can be made shorter as the anode shorting rate is made larger, reducing the reactive power consumed at the turn-off time or the turn-off time loss. However, in this case, the trigger sensitivity will be lowered.

Anode shorting rate ASR is defined by the following equation:

$$ASR = S1/S2 \times 100 \, (\%)$$

where S1 is a contact area of the anode electrode (56) and the shorting portion (58), and S2 is a projection area of the emitter layer (54) projected onto the anode electrode (56).

SUMMARY OF THE INVENTION

This invention has been made in view of the fact described above, and a first object of this invention is to provide a switching device capable of attaining a sufficiently high trigger sensitivity and short turn-off time.

A second object thereof is to provide a semiconductor switching device in which both the trigger sensitivity and turn-off loss can be properly set by optimally selecting the impurity concentration of a buffer layer of the anode shorting structure.

A third object of this invention is to provide a device of a pnpn structure, such as a GTO, having an anode shorting structure in which a high impurity concentration buffer layer is so formed as to obtain a high trigger sensitivity.

The first object of this invention can be attained by a device having an anode shorting structure, in which a buffer layer of low resistivity is formed between a first emitter layer and a first base layer and a shorting portion formed between the low resistance buffer layer and an anode electrode is localized in a longitudinal direction of the long and narrow second emitter layer, to thereby make a contact area between the shorting portion and the anode electrode materially smaller than the area of a projection of the second emitter layer projected onto the anode electrode.

With this configuration, it is possible to avoid lowering of the gate trigger sensitivity which may occur when the shorting resistance is made extremely small. This makes it possible to provide a GTO which has a sufficiently high gate trigger sensitivity and short gate turn-off time.

To achieve the second object, a device of this invention has a configuration wherein a first base layer of high resistivity with a second conductivity type is formed on a buffer layer of low resistivity with the second conductivity type which is formed on a first emitter layer of a first conductivity type. A second base layer of the first conductivity type is formed on the first base layer. One or more second emitter layers of the second conductivity type are separately formed on the second base layer. First and second main electrodes are formed in contact with the first and second emitter layers, respectively. A gate electrode is formed in contact with the second base layer. In this configuration, part of the buffer layer extends, through the first emitter layer, to reach the first main electrode, thus forming shorting portions with the first main electrode.

In the above device, assume that an interval between the shorting portions is d (cm) and the sheet resistance of the buffer layer is ps ($\Omega/\square$). Then, ρs is determined to satisfy the following equation:

$$\rho s = K(1/d^2)$$

$$(10^{-2} \leq K \leq 10^6)$$

provided that the radius of the shorting portions is set sufficiently smaller than interval d.

With the above configuration, a switching device such as a gate turn-off thyristor, having small turn-off loss and high gate trigger sensitivity, can be obtained by optimally setting the sheet resistance of the buffer layer of low resistivity to a proper value to be based on the pattern of the anode shorting structure.

The third object of this invention can be attained by a device having a basic pnpn structure. This structure includes a first emitter layer of a first conductivity type, a first base layer of a second conductivity type, a second base layer of the first conductivity type, and a second emitter layer of the second conductivity type. A first emitter electrode is formed on the first emitter layer so that the first emitter layer is short-circuited to the first base layer. A second emitter electrode is formed on the second emitter layer. A gate electrode is formed on second base layer. A buffer layer of the second conductivity type with low resistivity is formed on that surface of the first base layer which faces the first emitter layer. In the above structure, sheet resistance ρsN ($\Omega/\square$) of the buffer layer with the low resistivity is set to satisfy the following condition:

$$400 \leq \rho sN \leq 10000.$$

Under the above condition, a GTO having a short turn-off time and a sufficiently high gate trigger sensitivity can be obtained, irrespective of the size and/or location of the shorting portion formed by the first emitter electrode between the first emitter layer and first base layer, by optimally setting the sheet resistance of the buffer layer with the low resistivity to a proper value.

BRIEF DESCRIPTION OF THE DRAWINGS

FIG. 1 shows the construction of a GTO according to a first embodiment of this invention, wherein FIG. 1(a) is a plan view and FIGS. 1(b) and (c) are cross-sectional views;

FIG. 2 shows the construction of a GTO according to a second embodiment of this invention, wherein FIG. 2(a) is a plan view and FIGS. 2(b) and (c) are cross-sectional views;

FIG. 3 shows the construction of a GTO according to a third embodiment of this invention, wherein FIG. 3(a) is a plan view and FIGS. 3(b) and (c) are cross-sectional views;

FIG. 13 shows the construction of a GTO according to a fourth embodiment of this invention, wherein FIG. 13(a) is a plan view, FIGS. 13(b) and (c) are cross-sectional views.

FIGS. 14 to 16 are diagrams for explaining the characteristics of the embodiments;

FIG. 17 shows the construction of a GTO according to a fifth embodiment of this invention, wherein FIG. 17(a) is a plan view and FIGS. 17(b) and (c) are cross-sectional views of the GTO of FIG. 17(a) taken along lines A—A' and B—B';

FIGS. 18 to 20 respectively show cross-sectional views of GTO's having amplifying gates according to sixth to eighth embodiments of the present invention;

FIGS. 21 to 26 are cross-sectional views of various devices according to other embodiments of the present invention, wherein FIG. 21 shows an SI thyristor, FIG. 22 shows a BI-FET, FIG. 23 shows a P-ch MOS GTO, FIG. 24 shows an N-ch MOS GTO, FIG. 25 shows a MOS thyristor, and FIG. 26 shows a MOS thyristor with off-gate;

FIGS. 27 and 28 are diagrams for explaining the characteristics of the embodiments;

FIGS. 33 and 34 are cross-sectional views of prior art GTOs, wherein

DETAILED DESCRIPTION OF THE PREFERRED EMBODIMENTS

Figure 2:
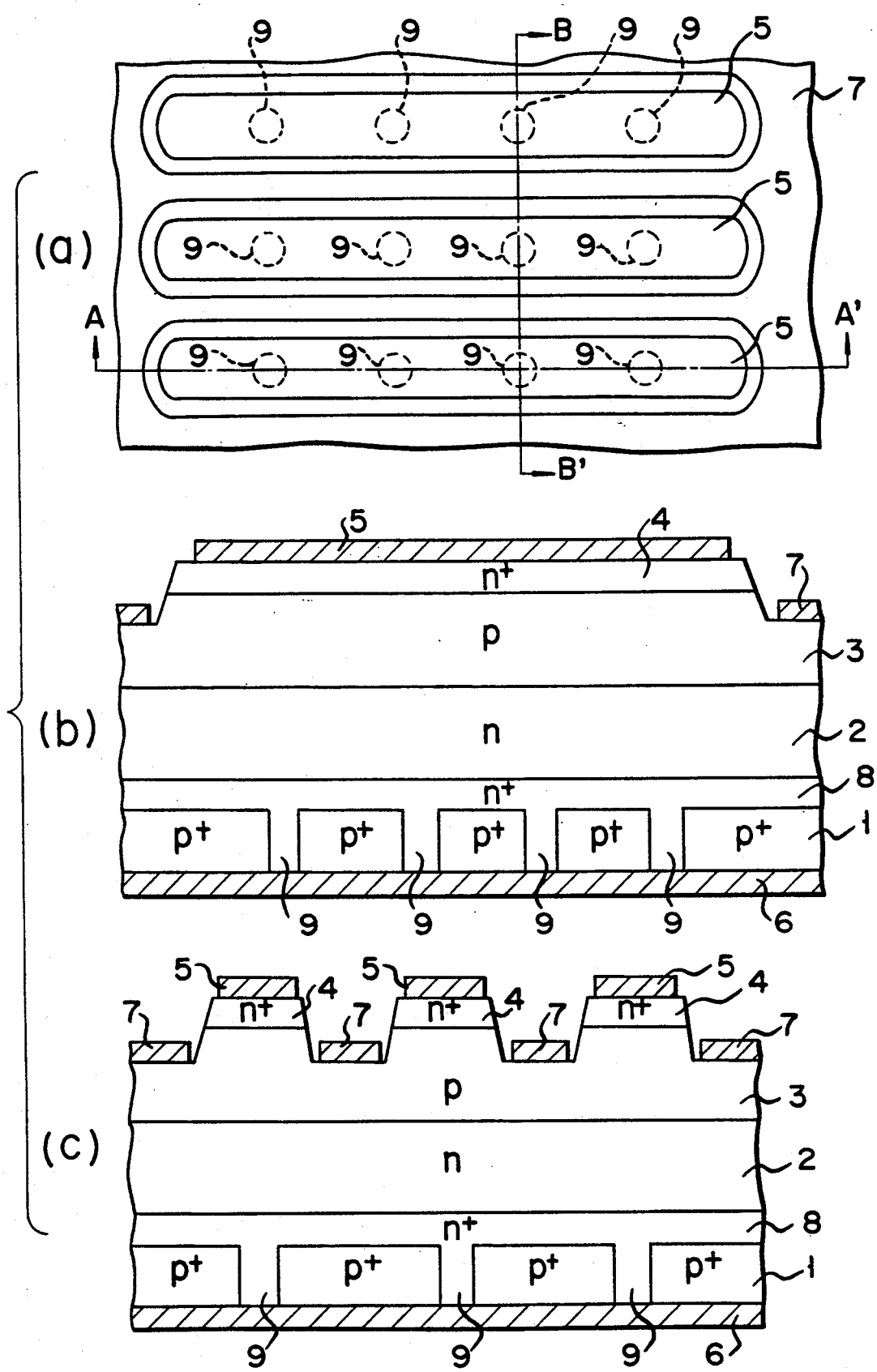

There will now be described an embodiment relating to the first object of this invention.

FIGS. 1(a) to (c) show the construction of a GTO as an example of a switching device according to one embodiment of this invention. FIG. 1(a) is a top plan view of the GTO as viewed from the cathode side, and FIGS. 1(b) and (c) are cross-sectional views of the GTO of FIG. 1(a) taken along lines A—A' and B—B', respectively.

The GTO has a pnpn structure comprising p+-type emitter layer (first emitter layer) 1, n⁻-type base layer of high resistivity (first base layer) 2, p-type base layer (second base layer) 3 and n+-type emitter layers (second emitter layer) 4 which are separately formed in long and narrow patterns. Further, n+-type buffer layer of low resistivity 8 is formed between p+-type emitter layer 1 and n⁻-type base layer 2.

Anode electrode (first main electrode) 6, cathode electrodes (second main electrode) 5 and gate electrode 7 are respectively formed on the surface of p+-type emitter layer, 1, n+-type layers 4 and p-type base layer 3. Those portions of n+-type buffer layer 8 which correspond in position to the cathode electrodes extend to anode electrode 6 to make a flat surface with p+-type emitter layer 1 and contact with anode electrode 6. The portions of p+-type layer 1 and n+-type layer 8 which are shorted by electrode 6 are used as shorting portions 9.

Figure 6:
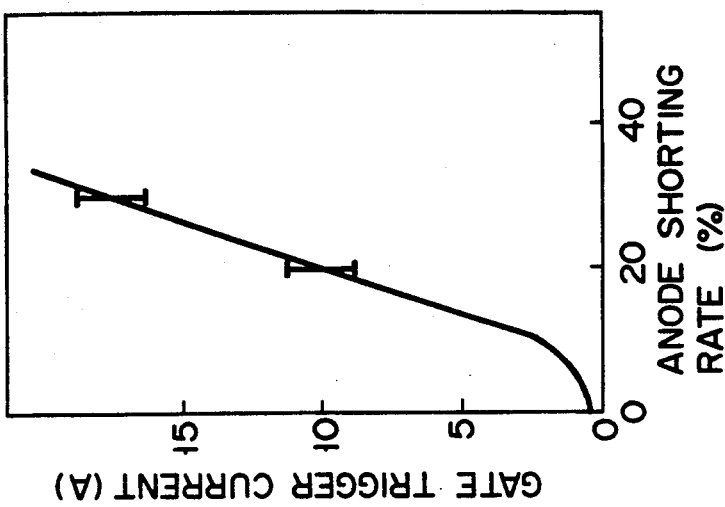
FIG. 6 exemplifies a relation between the gate trigger current and the anode shorting rate at the anode shorting portion.

Shorting portions 9 are provided in positions corresponding to those portions of n+-type emitter layers 4 which are restricted in the longitudinal direction (direction along line A—A' in FIG. 1(a)) of n+-type emitter layers 4. Each of them is formed in a circular form as shown in FIG. 1(a) and the diameter is set smaller than 1/10 of the length of n+-type emitter layers 4 in a longitudinal direction, for example. The value of 1/10 is derived based on the fact that the gate current rapidly increases as the anode shorting rate exceeds 10% as shown in FIG. 6. This is explained more in detail later.

In the above example, the pattern of shorting portions 9 is formed in a circular form, but it can be a square, rectangular, ellipse or any other forms. Further, each unit of GTO is formed for each of cathode electrodes 5.

FIG. 2 shows the construction of a GTO according to a second embodiment of this invention, FIG. 2(a) being a plan view as viewed from the cathode side, and FIGS. 2(b) and (c) being cross-sectional views of FIG. 2(a) taken along lines A—A' and B—B', respectively. In this embodiment, four shorting portions 9 are provided in the longitudinal direction of n+-type emitter layer 4 for each emitter layer 4.

If the area size of shorting portions 9 and the impurity concentrations of layers 1 and 8 are set constant and when a plurality of shorting portions 9 are provided as shown in FIG. 2, then the turn-off loss of the GTO becomes small with increase in the number of shorting portions 9. In contrast, with increase in the number of shorting portions 9, the shorting resistance becomes small, lowering the trigger sensitivity of the GTO. Therefore, in order to attain the same characteristics as those obtained in FIG. 1 using a GTO of the structure shown in FIG. 2, the area of individual shorting portions 9 of FIG. 2 is made smaller than that of FIG. 1, or the impurity concentrations of layer 8 is made lower than those of FIG. 1. Thus, the number of shorting portions 9 can be freely set on a case-by-case basis.

FIGS. 3(a) to (c) show the construction of a GTO according to a third embodiment of this invention. FIG. 3(a) is a top plan view of the GTO as viewed from the cathode side, and FIGS. 3(b) and (c) are cross-sectional views of the GTO of FIG. 3(a) taken along lines A—A' and B—B', respectively. In the GTO, p+-type emitter layer 1 corresponding to each of n+-type emitter layers 4 is divided into a plurality of sections by means of isolating section 11 whose surface is covered with insulation film 12. Division of p+-type emitter layer 1 suppresses the diffusion of carriers in the turn-on state of the GTO, enhancing the turn-off speed.

Figure 4:
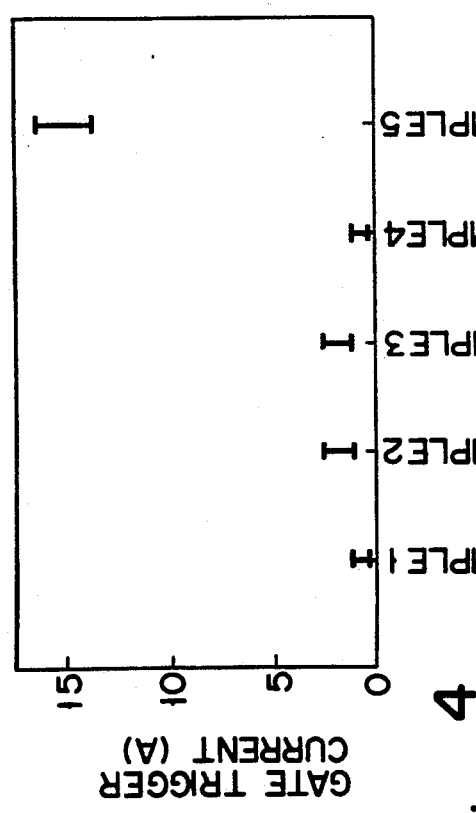
FIG. 4 shows gate trigger current characteristics of the prior art GTO and the GTO of this invention.
Figure 5:
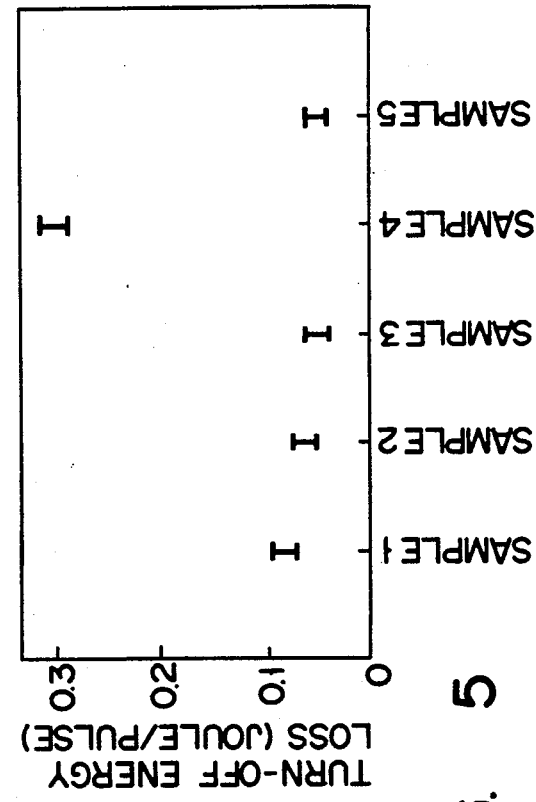
FIG. 5 shows turn-off energy loss characteristics of the prior art GTO and the GTO of this invention.
Figure 33:
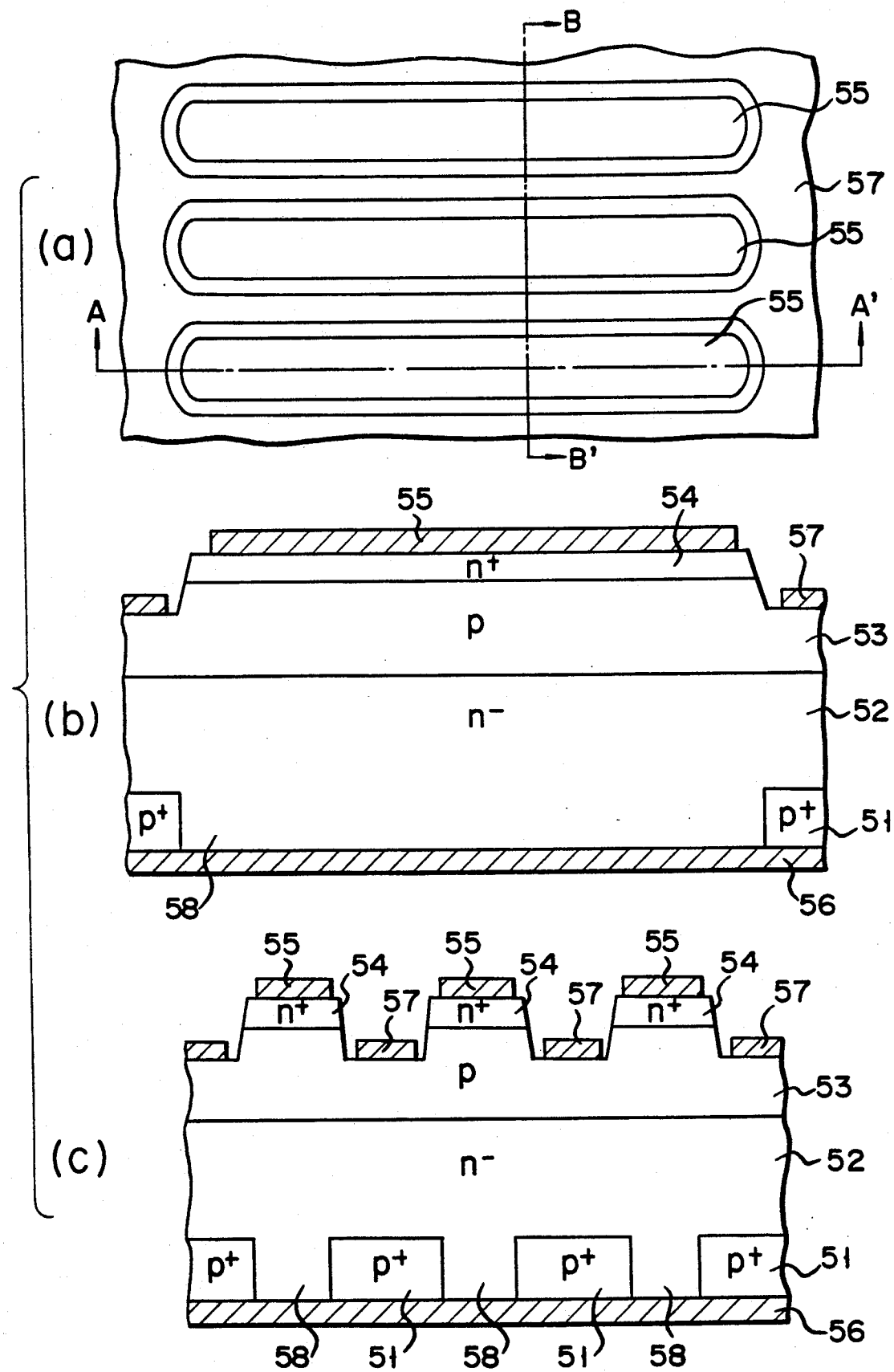

The advantage of this invention is explained with reference to FIGS. 4 and 5 in comparison with the prior art GTO shown in FIGS. 33 and 34. In FIG. 4, the ordinate represents the gate rigger current, and in FIG. 5, the ordinate represents the turn-off energy loss. The reduced turn-off time results in a small tail current or short turn-off time, to thereby enable high frequency operation. In FIGS. 4 and 5, samples 1, 2, 3, 4, and 5 respectively correspond to GTOs shown in FIGS. 1, 2, 3, 33 and 34. In this case, the on-state voltage is kept constant (approx. 3 V).

As can be seen from FIGS. 4 and 5, in the prior art GTO of sample 4, the gate trigger current is small but the turn-off energy loss is large, and in the prior art GTO of sample 5, the turn-off energy loss is small but the gate trigger current is large. In contrast, in samples 1 to 3 of this invention, small gate trigger current and small turn-off energy loss can be attained at the same time.

FIG. 6 shows the relation between the gate trigger current and the anode shorting rate (the ratio of area of shorting portions 9 to the area of n+-type emitter layer 4) at shorting portions 9. As is clearly seen from FIG. 6, the gate trigger current rapidly increases when the anode shorting rate exceeds 10%. Therefore, as explained in the embodiment of FIG. 1, if the anode shorting portions are formed in positions corresponding to those portions of the n+-type emitter layers, which are restricted in the longitudinal direction of the n+-type emitter layers to set the anode shorting rate smaller than 10%, then a GTO having a sufficiently high gate trigger sensitivity and a short turn-off time can be obtained.

Figure 34:
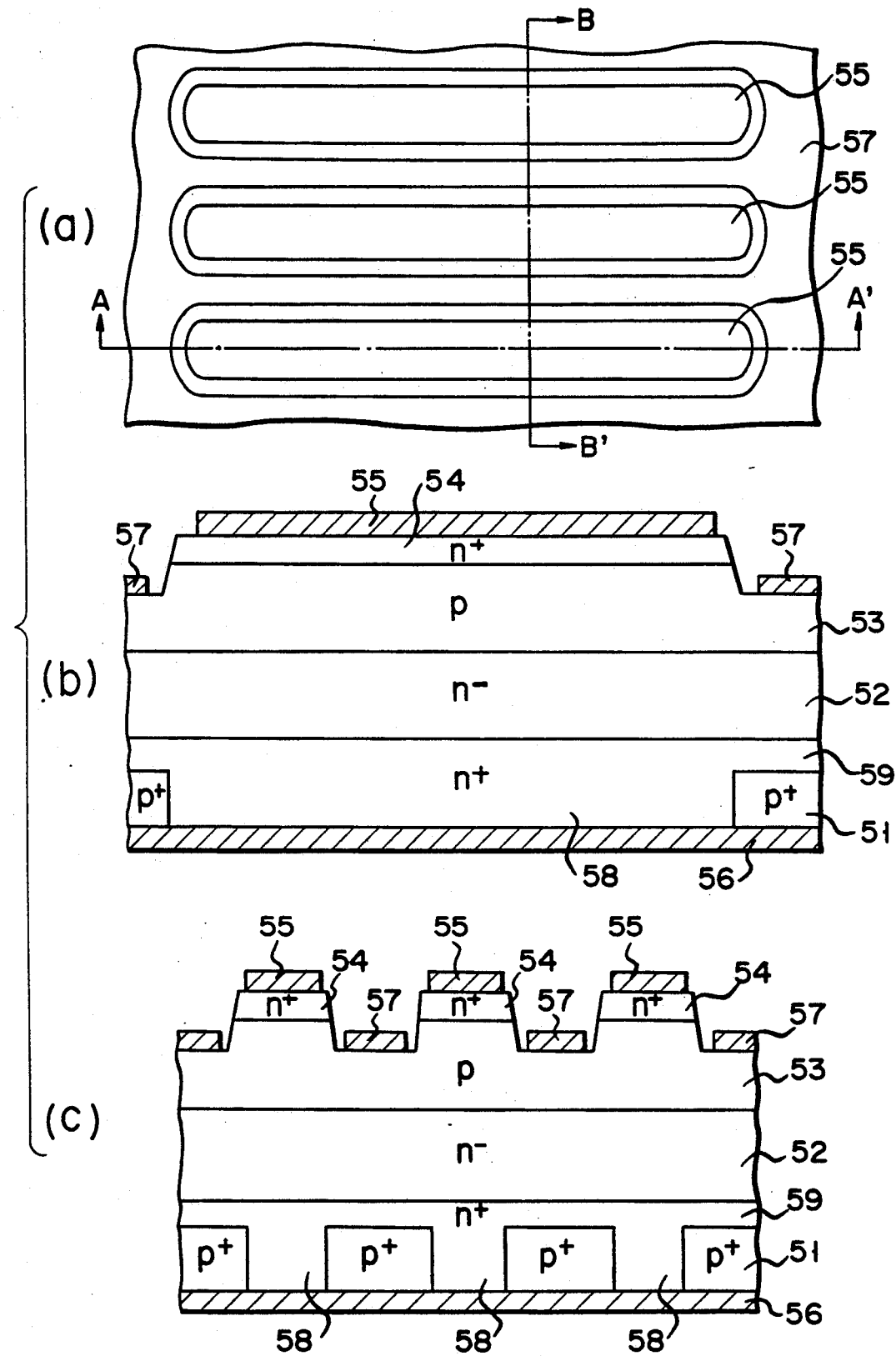

In the prior art GTO of FIG. 34, if the size of shorting portion 58 in the width direction of long and narrow n+-type emitter layer 54 is made small, the shorting resistance between the base and emitter of the pnp transistor is not changed very much and therefore a remarkable effect cannot be obtained. Thus, only when the size of shorting portion 58 in the longitudinal direction of long and narrow n+-type emitter layer 54 is made small, a remarkable effect can be obtained.

As described above, according to the pnpn switching device of this invention, the size of the anode shorting portion is restricted in the longitudinal direction of the cathode, in order to obtain a GTO having the anode shorting structure with a low resistance buffer layer in which both the sufficiently high gate trigger sensitivity and the short turn-off time can be attained.

Now, an embodiment relating to the second object is explained.

Figure 3:
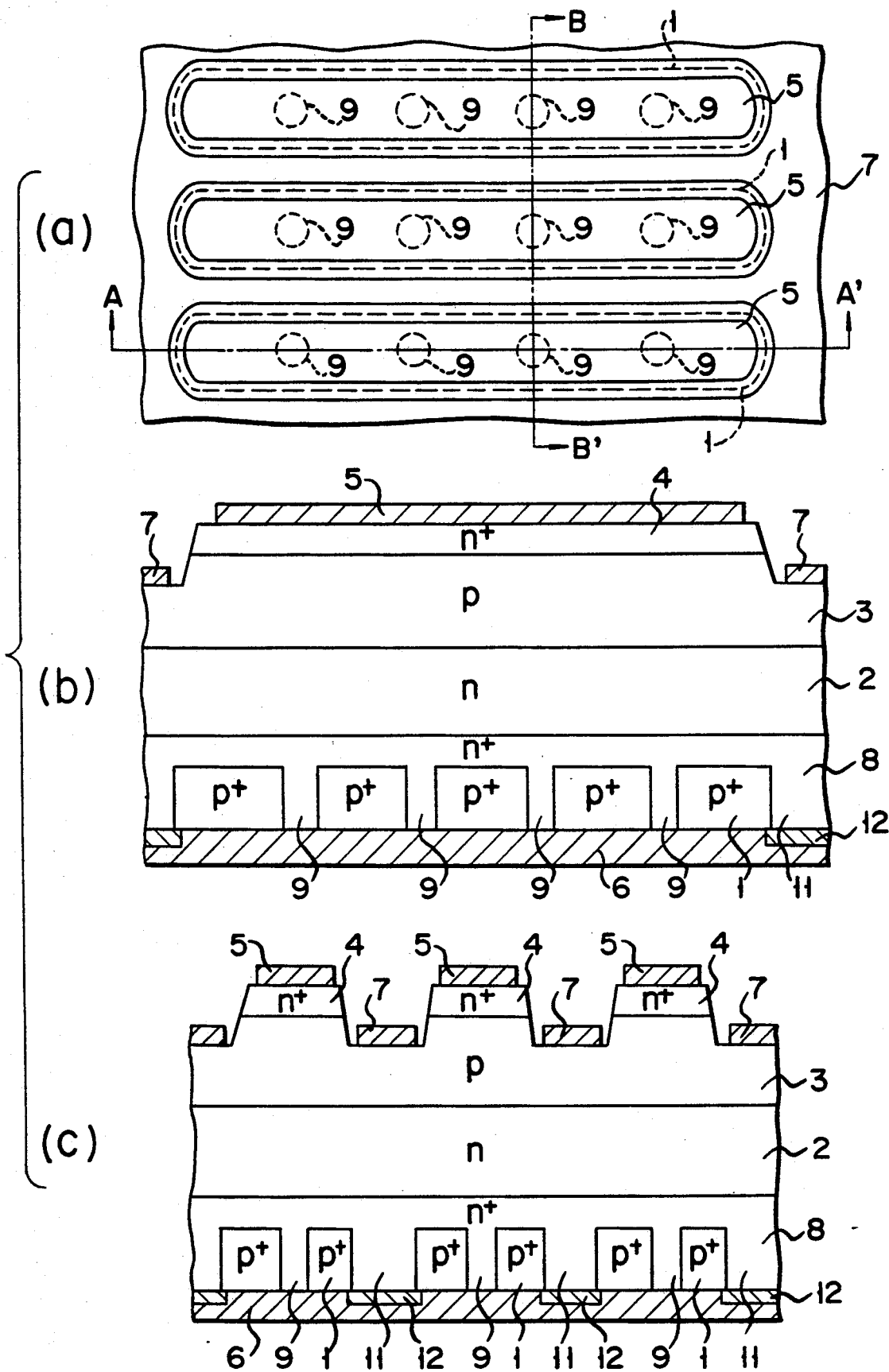

With this construction as shown in FIGS. 1 to 3, if the interval between shorting portions 9 is d (cm) and the sheet resistance of low resistance buffer layer 8 is $\rho s$ ($\Omega/\square$), then $\rho s$ is determined to satisfy the following equation:

$$\rho s = K(1/d^2) \tag{1}$$

where $10^{-2} \leq K \leq 10^6$.

In this case, sheet resistance $\rho s$ can be expressed as follows when the average resistivity of a diffusion layer is $\rho$ ($\Omega$·cm) and the thickness thereof is t (cm):

$$\rho s = \rho/t \tag{2}$$

The sheet resistance can be easily obtained by use of a 4-probe method which is effected by selectively etching out p+-type emitter layer 1 from the anode side of the GTO to expose part of n+-type buffer layer 8, and placing four probes in contact with the exposed surface of n+-type buffer layer 8.

Assume that the positional function in the depth direction of n+-type buffer layer 8 is x, the distribution of impurity concentration of n+-type buffer layer 8 is N(x), the mobility of electrons is $\mu(x)$ and the unit charge is q. Then, $\rho s$ can be expressed as follows:

$$\rho s = 1/q \int_A^B \mu(x) \cdot N(x) \cdot dx \tag{3}$$

where A and B are lower and upper limits defining the range of n+-type buffer layer 8 in the thickness direction.

Figure 7:
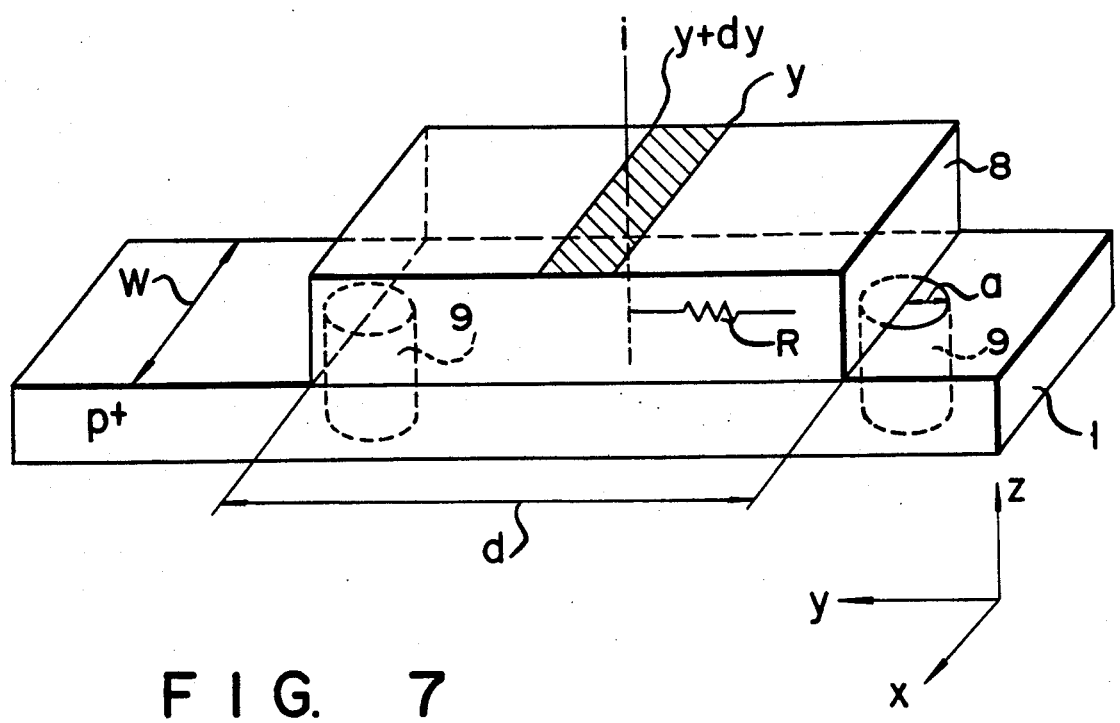
FIG. 7 is a perspective view schematically showing part of a GTO according to the present invention.

FIG. 7 is a perspective view of p+-type emitter layer 1 and n+-type buffer layer 8 taken out from the GTO of the embodiment shown in FIG. 1. Assume that the density of current flowing in n+-type buffer layer 8 per unit area is i, the interval between shorting portions 9 is d, the radius of shorting portion 9 is a, the threshold voltage of a pn diode formed of p+-type emitter layer 1 and n+-type buffer layer 8 or a voltage required for causing carriers to be injected from p+-type emitter layer 1 into n+-type buffer layer 8 is Vj, and the width of p+-type emitter layer 1 is W. Then, voltage Vj can be obtained as follows:

$$Vj = \int_a^{d/2} R \cdot i \cdot W \cdot dy \tag{4}$$

where R is a resistance in the lateral direction of n+-type buffer layer 8 ranging from an area through which current i·W·dy flows to shorting portion 9, and is expressed as follows:

$$R = (\rho s y)/W \tag{5}$$

The following equation can be obtained by substituting Eq. (5) into Eq. (4);

$$Vj = \int_a^{d/2} \rho s \cdot i \cdot y \cdot dy \tag{6}$$
$$= \{i \cdot \rho s/2\} \{(d^2/4) - a^2\}$$

In this case, if Vj=0.5 V, and d>>a, $\rho s$ is expressed as follows:

$$\rho s = \{4/i\}\{1/(d^2 - 4a^2)\} \approx \{4/i\}\{1/d^2\} \tag{7}$$

In the case where the GTO is constructed to have an amplifying gate or to receive a gate trigger current in a pulse form from an external circuit, the value of K is calculated in the following manner.

Assume now that an area for each GTO element is $0.27 \times 400 \times 10^{-4} = 1.1 \times 10^{-2}$(cm$^2$), for example, a gate trigger current $I_{GT}$ flowing into the GTO with a diameter of 3.3 (cm) is 1200 (A) and the GTO includes 248 GTO elements. Then, current $I_{GT}$ flowing into each GTO element is expressed as follows:

$$I_{GT} = 1200/248 = 4.8(A) \tag{8}$$

Therefore, the maximum value $i_{MAX}$ of i in Eq. (7) can be expressed as follows:

$$i_{MAX} = 4.8(A)/1.1 \times 10^{-2}(cm) = 436.4 \, (A/cm^2) \tag{9}$$

At this time, the value of K or 4/i of 0.01 is obtained.

The upper limit is $\rho s$ is $10^4$ ($\Omega/\square$) when the GTO elements are manufactured. If $\rho s$ is set larger than the upper limit, a punchthrough will occur, lowering the breakdown voltage. In this case, if the length of the GTO element is set at 10 (cm) and shorting portions are provided for respective GTO elements, the following equation is obtained:

$$10^4 = K(1/10^2) \tag{10}$$

Therefore, the range of K is defined between 0.01 and $10^6$.

In the case where the GTO is constructed to have no amplifying gate or the gate trigger current is not supplied to the GTO in the pulse form, $I_{GT}$ is set less than 50 (A) and the range of K is set such that $0.2 \leq K \leq 10^6$. In this case, it will be necessary to change the upper limit of K when considering that the size of each GTO element is set smaller than 1 cm and one shorting portion 9 is provided for each GTO element, and the range of K is set such that $0.2 \leq K \leq 10^4$.

Figure 8:
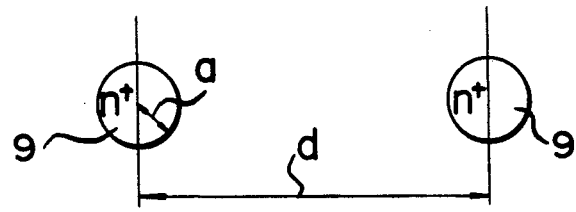
FIGS. 8 and 9 respectively illustrate the interval between shorting portions, and between the shorting portion and the projection of an emitter pattern.
Figure 10:
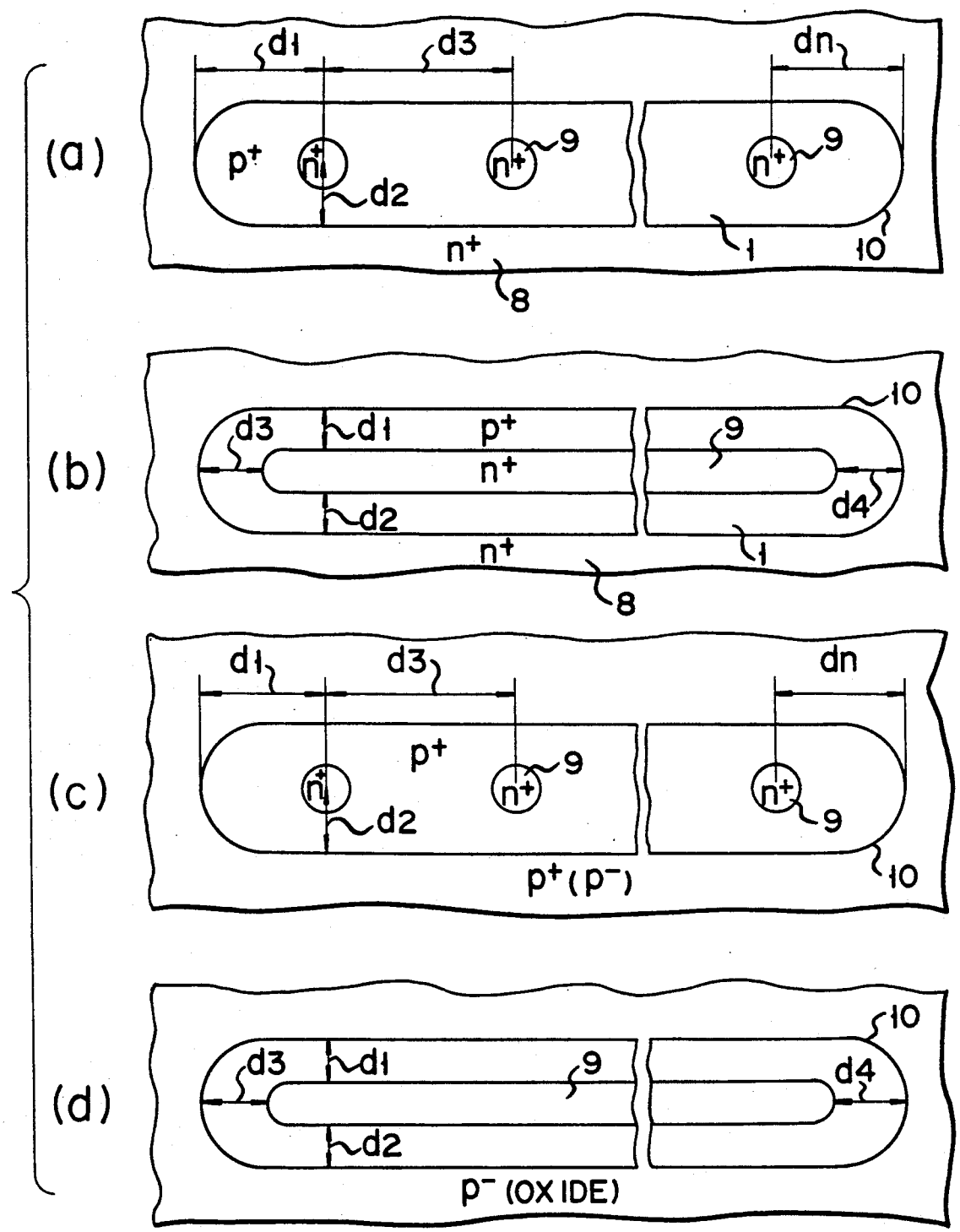
FIG. 10 is a diagram for explaining the interval by taking specific examples.

FIGS. 8 and 10 are diagrams for illustrating the interval d between shorting portions 9. In the case where a plurality of shorting portions 9 are provided in the longitudinal direction of n+-type emitter layer 4, d is generally defined as a distance between the centers of two adjacent shorting portions 9 as shown in FIG. 8.

Figure 9:
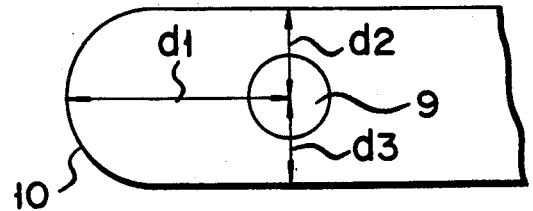

Assume a case where the pattern of n+-type emitter layer 4 is projected onto p+-type emitter layer 1, and interval d is smaller than the distance between the center of shorting portion 9 and edge portion 10 of the projected pattern of emitter layer 4. Then, d is determined as the maximum one of distances 2d1, 2d2 and 2d3 between the center of shorting portion 9 and the respective edge portions 10 of the projected pattern of $n^+$-type emitter layer 4, as shown in FIG. 9.

FIG. 10(a) shows a case where a plurality of shorting portions 9 are provided in the longitudinal direction of $n^+$-type emitter layer 4, and $p^+$-type emitter layer 1 is surrounded by $n^+$-type layer 8. In this case, interval d is determined by the width of $p^+$-type emitter layer 1, i.e., 2d2.

In a case where $p^+$-type emitter layer 1 is surrounded by $n^+$-type layer 8 while no shorting portion is provided therein, interval d is also determined by the width (2d2) of $p^+$-type emitter layer 1.

FIG. 10(b) shows the case where shorting portion 9 is provided in the form of ellipse extending in the longitudinal direction of $n^+$-type emitter layer 4, and $p^+$-type emitter layer 1 is surrounded by $n^+$-type layer 8. In this case, interval d is determined by the maximum one of distances d1, d2, d3 and d4.

FIG. 10(c) shows the case where a plurality of shorting portions 9 are provided in the longitudinal direction of $n^+$-type emitter layer 4, and $p^+$-type emitter layer 1 is surrounded by a $p^+$-type or $p^-$-type layer. In this case, interval d is determined by the maximum one of distances 2d1, 2d2, d3, ..., $d_{n-1}$, ..., and 2dn, wherein suffix n denotes an integer; d1, d2, ... dn respectively denote distances between the center of shorting portion 9 and the edge of a projected pattern which is obtained by projecting the pattern of the $N^+$ emitter layer 1 onto the $p^+$ emitter layer; and d3 to dn-1 respectively denote intervals between shorting portions 9.

FIG. 10(d) shows the case where shorting portion 9 is provided in the form of ellipse extending in the longitudinal direction of $n^+$-type emitter layer 4, and $p^+$-type emitter layer 1 is surrounded by $p^+$-type layer 8, $p^-$-type layer or an insulation film (oxide film). In this case, interval d is determined by the maximum one of distances 2d1, 2d2, 2d3 and 2d4.

Figures 11, 13D:
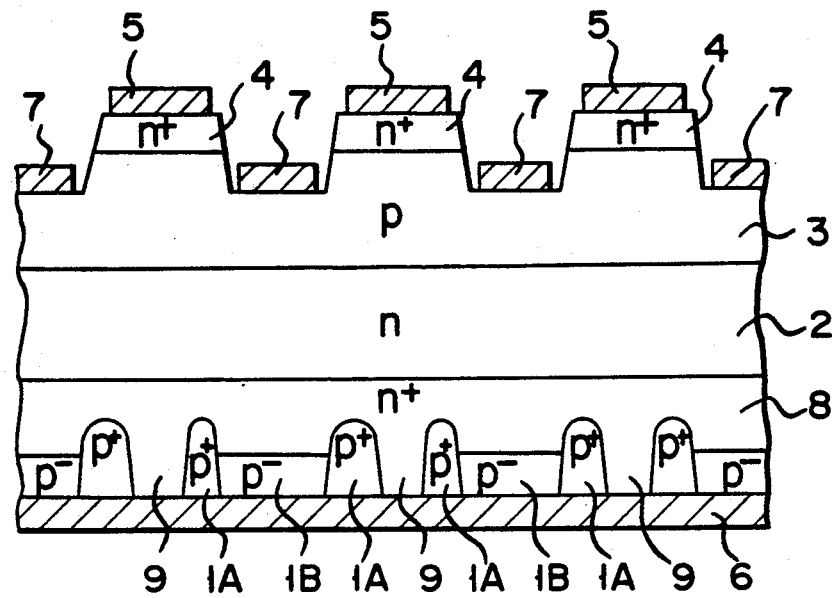
FIG. 11 exemplifies numeric values of parameters used under various conditions in each embodiments of the present invention.
FIG. 13(d) is a modification of FIG. 13(c)

FIG. 11 is a diagram showing the result of checking the operation of GTOs explained in the former embodiments and manufactured to have different values of K. The GTO's used are formed to have a diameter of 3.3 cm and formed of anode shorting structure having an $n^+$-type buffer layer. In FIG. 11, d is an interval between shorting portions 9 and ρs is a sheet resistance of $n^+$-type buffer layer 8. In this example, ρs is set at two different values of 228 (Ω/□) and 975 (Ω/□), and d is set at four different values of 0.28 (cm), 0.18 (cm), 0.11 (cm) and 0.016 (cm). Interval d of 0.28 (cm) is set for the GTO shown in the FIG. 1 embodiment in which one shorting portion is provided for each GTO element. Interval d of 0.18 (cm) is set for the GTO in which two shorting portions are provided for each GTO element. Interval d of 0.11 (cm) is set for the GTO in which three shorting portions are provided for each GTO element. Interval d of 0.016 (cm) is set for the GTO in which one shorting portion of the ellipse form is provided for each GTO element. This value of d is substantially the same as the interval of shorting portions of a conventional anode shorting structure in which no $n^+$-type buffer layer is provided.

When K is set at 16.6, 7.4, 2.7, 71.1, 31.6 or 11.4, it is determined that the device properly functions as a GTO, provided a gate trigger current of 50A is applied. In contrast, it is determined that the device does not function as a GTO when K is set at 0.06. It is also determined that when K is set at 0.3, gate trigger current $I_{GT}$ is increased but the device functions as a GTO. As a result, if the value of K is set such that $0.3 < K$, a device functioning as a GTO can be obtained.

Figure 12:
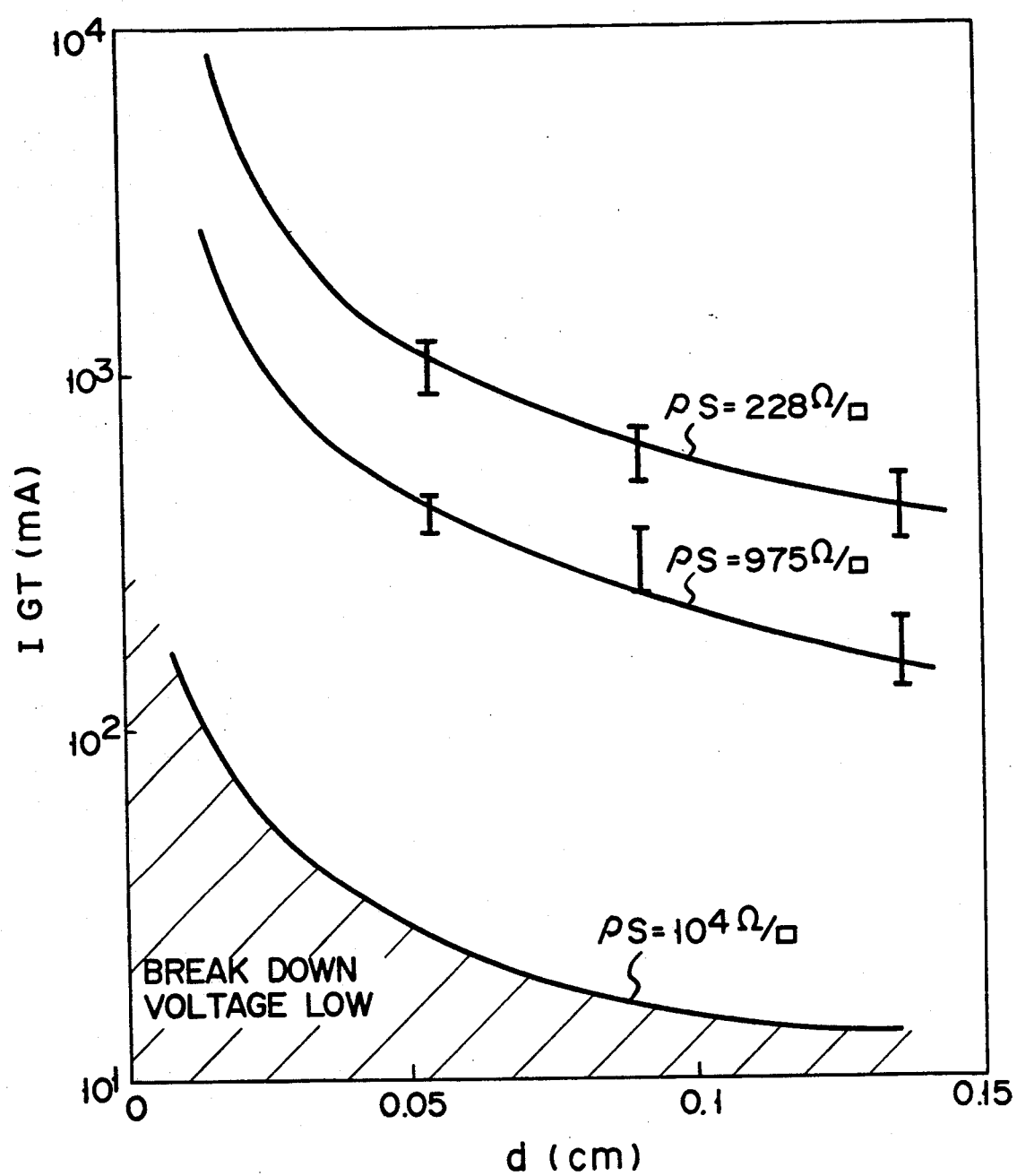
FIG. 12 shows a diagram obtained under various parameters of ρs.

FIG. 12 is a characteristic diagram showing the relation between the interval d (cm) and gate trigger current $I_{GT}$ (mA) when sheet resistance ρs of $n^+$-type buffer layer 8 is changed. In the figure, a lower hatched portion indicates an area in which a punch-through may occur, making it difficult to attain a proper breakdown voltage design.

When the value of K is set as described above, the gate trigger current (gate sensitivity) of the GTO having an $n^+$-type buffer layer can be set equal to a prescribed value suitable for its gate circuit, and the turn-off loss thereof can be materially reduced. Incidentally, how the turn-off loss is reduced will be described later with reference to FIG. 14.

In the following, other embodiments according to the first and second objects of this invention will be described.

FIGS. 13(a) to (c) show the construction of a GTO according to a fourth embodiment of this invention. FIG. 13(a) is a top plan view of the GTO as viewed from the cathode side, and FIGS. 13(b) and (c) are cross-sectional views of the GTO of FIG. 13(a) taken along lines A—A' and B—B', respectively. In the GTO, $p^+$-type emitter layer 1 is formed to have low resistance $p^+$-type layer 1A having a high impurity concentration of $1 \times 10^{16}/cm^3$ and high resistance $p^-$-type layer 1B having a low impurity concentration of $4 \times 10^{13}/cm^3$. In each GTO element, low resistance layer 1A is formed to surround shorting portion 9 and high resistance layer 1B is formed to surround low resistance layer 1A. Thus, low resistance layer 1A serving as a main current path in the on-state is isolated from the other GTO elements by means of high resistance layer 1B. Interval d between shorting portions 9 in this embodiment can be determined with reference to the case shown in FIG. 10(c).

Layers 1A and 1B can be formed by the following methods:

(1) A $p^-$-type layer corresponding to layers 1A and 1B is first formed and then p-type impurity is further doped into that portion of the $p^-$-type layer which corresponds to layer 1A, (2) $p^+$-type layer corresponding to layers 1A is formed and at the same time $p^-$-type layer corresponding to layer 1B is formed, and (3) $p^+$-type layer and $p^-$-type layer respectively corresponding to layers 1A and 1B are formed in different steps. With the method (2), layers 1A and 1B are formed in a form as shown in FIG. 13(d). In this case, the diffusion depth or ion-implantation depth of p-type impurity is not specifically limited, and layers 1A and 1B can be formed to take either form shown in FIG. 13(c) or (d).

Figure 13:
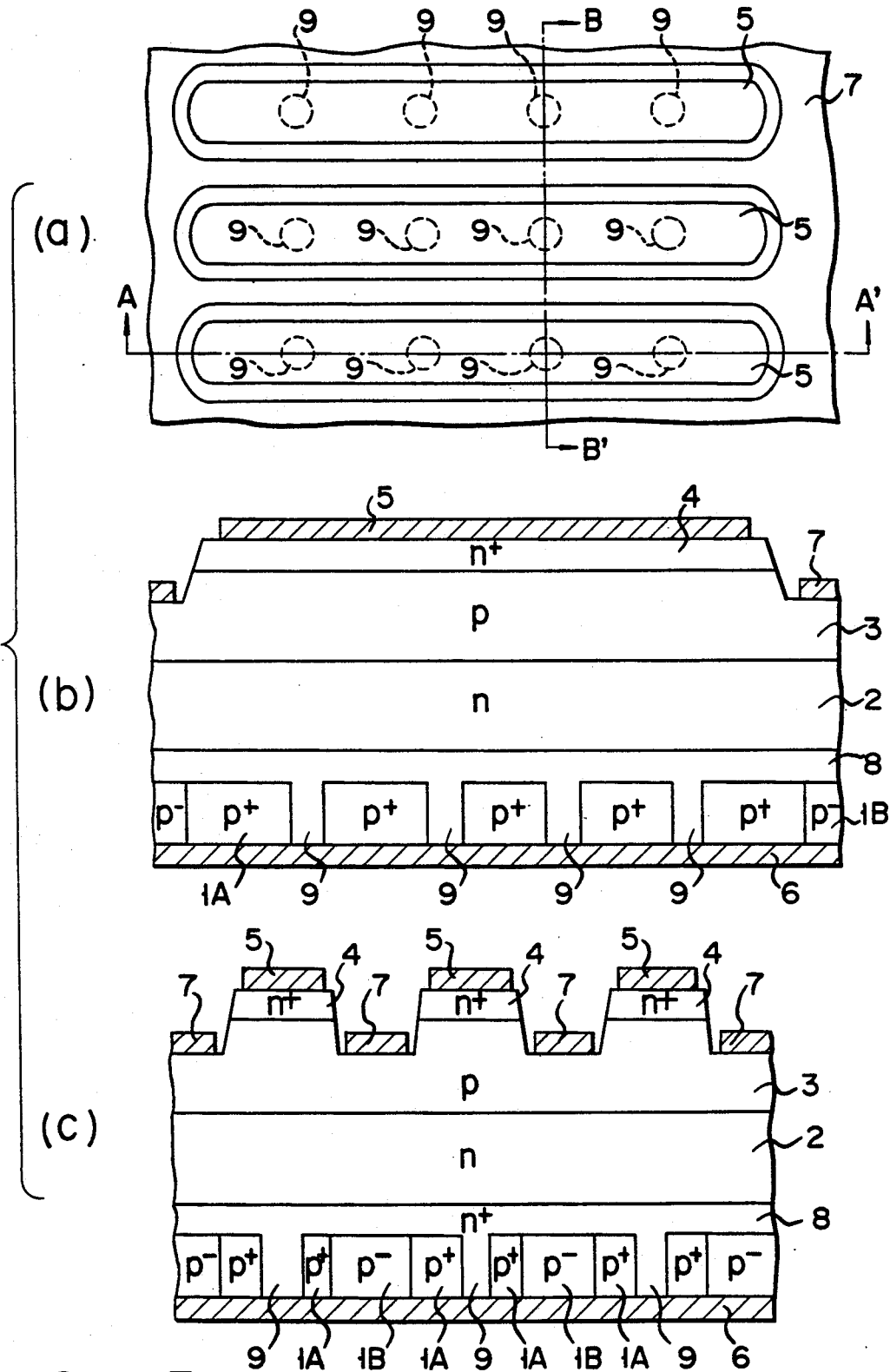

In the GTO in which $p^+$-type emitter layer 1 is formed to have low resistance $p^+$-type layer 1A having a high impurity concentration and high resistance $p^-$-type layer 1B having a low impurity concentration as shown in FIG. 13, the following effect can be attained.

That is, since low resistance layer 1A serving as a main current path in the on-state is isolated from the other GTO elements by means of high resistance layer 1B, the resistance in the lateral direction of $n^+$-type buffer layer 8 in each GTO element will become large. This enhances the gate sensitivity, suppresses the diffusion in the lateral direction of an ON current in the on-state, and reduces a tail current at the turn-off time, resulting in reducing the turn-off loss. The tail current decreases with time mainly due to the recombination of holes and electrons at the turn-off time of the GTO.

In the GTO of FIG. 1 in which one shorting portion is provided for each GTO element, p+-type emitter layer 1 can be formed to have low resistance layer 1A and high resistance layer 1B in the same manner as shown in FIG. 13.

In the following, advantages of the above embodiment will be described in detail, in comparison with the advantages of the first and second embodiments.

FIG. 14 is a characteristic diagram showing the relation between on-state voltage $V_{TM}(V)$ and turn-off loss Eoff (Joule/PULSE) of GTO's which are formed with the same diameter and in the same cathode pattern, and are formed to have no shorting portion (A), one shorting portion (B) and four shorting portions (C). That is, the characteristic diagram shows variation in the turn-off loss with the on-state voltage which is changed by controlling the lifetime of remaining carriers at the turn-off time by irradiation of electron beams. As is clearly seen from the characteristic diagram, as the number of shorting portions is increased to increase the anode shorting rate, the turn-off loss is decreased.

Figure 15:
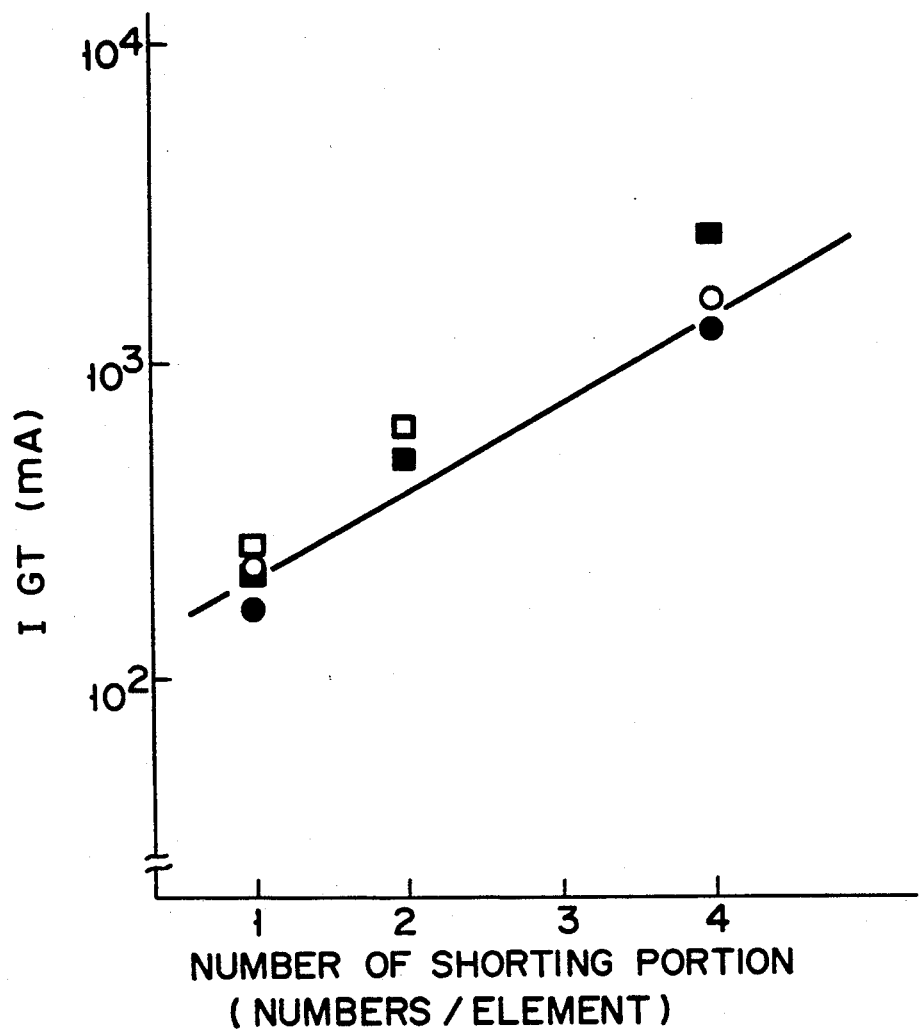

FIG. 15 is a characteristic diagram showing the relation between the number of shorting portions for each GTO element and gate trigger current $I_{GT}$(mA). From the characteristic diagram, it is understood that the gate trigger current increases as the anode shorting rate is increased.

As is clearly seen from FIGS. 14 and 15, in the case where p+-type emitter layer 1 is formed to have low resistance layer 1A and high resistance layer 1B and low resistance layer 1A is isolated from other GTO elements by means of high resistance layer 1B, diffusion of carriers in the on-state can be prevented and a tail current at the turn-off time can be suppressed without enlarging the area of shorting portion 9, or without lowering the trigger sensitivity. Incidentally, when low resistance layer 1A is isolated by high resistance layer 1B, the tail current is reduced by ⅔ as compared with that obtained when low resistance layer 1A is not isolated. The turn-off loss can thus be lowered.

FIG. 16 is a characteristic diagram showing the relation between on-state voltage $V_{TM}(V)$ and turn-off loss Eoff (Joule/PULSE) of GTO (A) of the embodiment in FIG. 13 and those of GTO (B) of the embodiment in FIG. 2. As is seen from the characteristic diagram, the turn-off loss is smaller in the GTO of FIG. 13 than in the GTO of FIG. 2.

Figure 17:
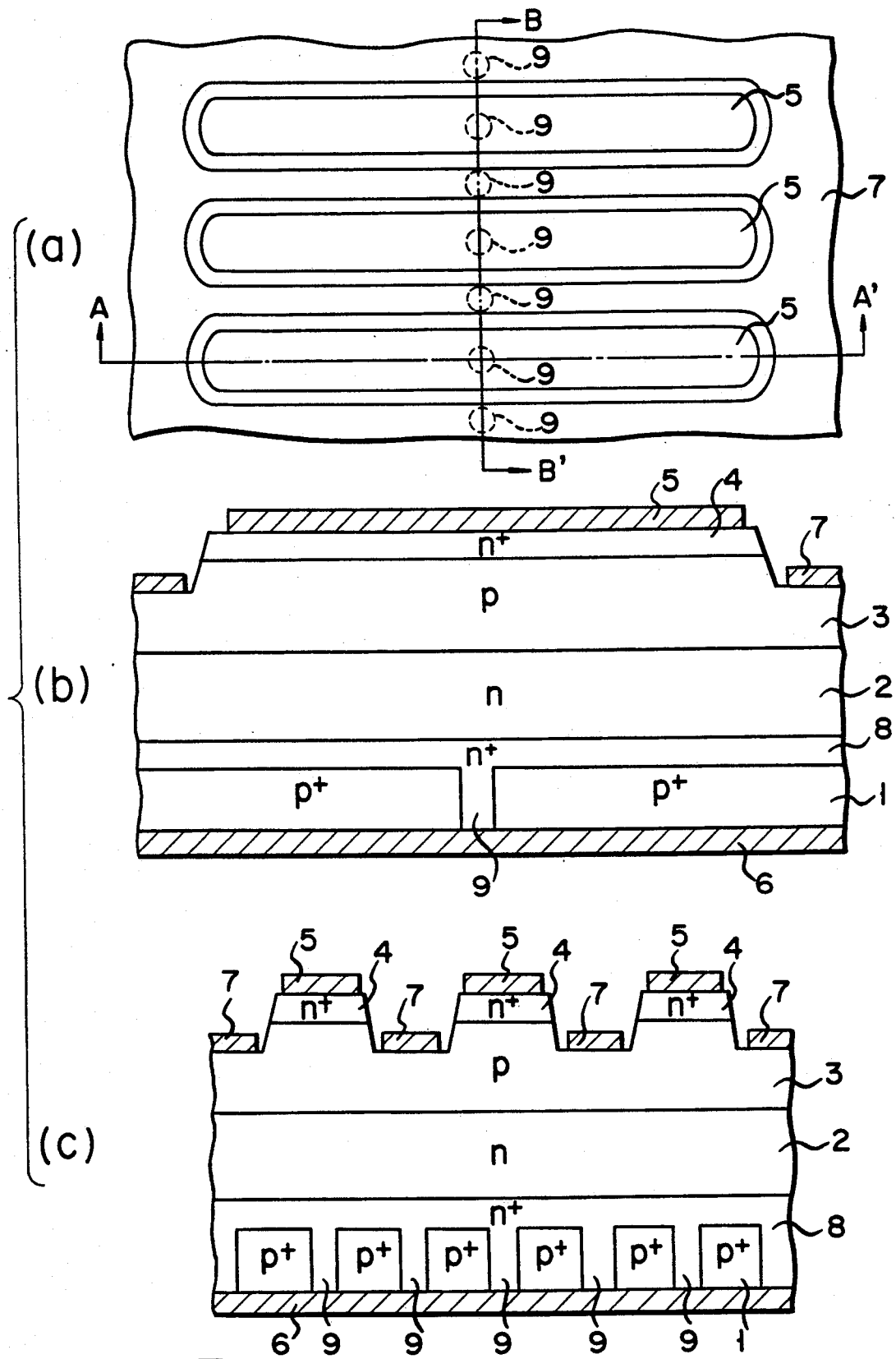

FIGS. 17(a) to (c) show a fifth embodiment which is a modification of the GTO shown in FIGS. 1(a) to (c). In the GTO of FIGS. 17(a) to (c), shorting portions 9 are formed not only under the cathode electrodes but also under gate electrodes 7.

FIGS. 18 to 20 respectively show sixth, seventh, and eighth embodiments according to the first and second objects of the present invention, wherein GTO's having amplifying gate structures are formed. The illustration of FIGS. 18 to 20 corresponds to the cross-section of FIG. 1 taken along A—A' line.

In the following, advantages derived from the embodiment of this invention, having amplifying gate structure, will be described.

As has been mentioned, according to the present invention, the anode shorting resistance in the structure of, for example, FIG. 1 or 2, can be materially reduced. Although the gate trigger sensitivity is lowered with the reduction in the anode shorting resistance, it is possible to prominently reduce the turn-off loss of the GTO. The amplifying gate structure can compensate for the lowering of the gate trigger sensitivity. Thus, according to the embodiment of FIG. 18, 19, or 20, it is possible to obtain substantially the same gate trigger sensitivity as that obtained by a prior art, while effectively reducing the turn-off loss.

According to a conventional GTO having an amplifying gate structure, the turn-on loss, itself, could be reduced. However, such a conventional GTO cannot reduce the turn-off loss without increasing its on-state voltage. In contrast, according to the embodiment of this invention, the turn-off loss can be effectively reduced while the amplifying gate part can keep the gate trigger sensitivity, as well as the on-state voltage, at the same order as those obtained by the conventional GTO.

In addition, according to the embodiment of the present invention, the anode shorting rate at the main GTO part can be independent of that of the amplifying gate part, so that the anode shorting rate of each of the main GTO and amplifying gate can be optionally determined to be based on the utility specification of the device. This is the advantage of the embodiment over a prior art GTO having an amplifying gate structure.

Incidentally, the present invention can be applied to an amplifying gate GTO disclosed in the following document:

Amplifying Gate Construction GTO Switching Characteristics (cf. FIG. 1)

Kohichi MURAKAMI, Nobuo ITAZU, Yoshinari UETAKE, Katsuyoshi MASE and Minami TAKEUCHI Toshiba Corporation, Transistor Works Power Semiconductor Device Engineering Department 1 Toshibacho, Komukai, Saiwaiku, Kawasaki 210, Japan.

IPEC - Tokyo 1983

In the embodiment of FIGS. 18 to 20, turn-on electrode 25 for turning-on the amplifying gate part is provided. The amplifying gate part includes n+emitter layer 30 and auxiliary electrode 31. As is well known, by connecting electrode 25 to electrode 7 via a diode, the amplifying gate part can be integrated with the GTO part.

Here, it should be noted that the cross-section of FIGS. 18 to 20 corresponds to the A—A' line cross-section of FIG. 1(a) as is shown by FIG. 1(b), not to the B—B' line cross-section thereof.

The GTO of FIGS. 18 to 20 will operate as follows. When a positive pulse is applied to electrode 25, the switching structure of layer 30 is first turned on. The gate sensitivity of this switching structure can be sufficiently high because there is no need to turn-on the whole structure of the GTO. After completing the turn-on of the switching structure, its turn-on current flows into cathode electrode 5, via auxiliary electrode 31, so that the injection from n+emitter 4 of the main GTO occurs. Then, the whole structure of the GTO is rendered to be turned-on.

When the GTO is to be turned-off, a current is extracted from the auxiliary GTO (30, 31) and from the main GTO. Then, the whole structure of the GTO is turned-off.

Thus, according to the GTO having an auxiliary GTO as the amplifying gate, the gate sensitivity of the auxiliary GTO can be designed independently of that of the main GTO. This feature enhances the advantage of the anode shorting structure according to the present invention.

More specifically, even if the anode shorting rate of the main GTO is enlarged by, for example, increasing the shorting area, the number of the shorting portion, and/or the impurity concentration of the n+buffer layer, the gate sensitivity of the auxiliary GTO can be made high. By doing so, it is possible to obtain a high-sensitivity GTO with a low turn-off energy characteristic.

The above feature can be obtained by the embodiment of FIG. 18 wherein the auxiliary GTO has no anode shorting portion, by FIG. 19 wherein the auxiliary GTO has an anode shorting portion, or by FIG. 20 wherein the number of the anode shorting portion at the auxiliary GTO part is less than that at the main GTO part. Thus, there are many optionally selectable manners to obtain the above feature.

Incidentally, even if the number of the anode shorting portion at the auxiliary GTO part is equal to that at the main GTO part, since the total number of the elements constituting the auxiliary GTO part is less than that constituting the main GTO part, the total sensitivity can be made high.

This invention can be applied to various devices structure. For example, this invention can be applied to an SI thyristor (static induction thyristor) having a cross-section shown in FIG. 21, a BI-FET (bipolar-mode MOS FET) having a cross-section shown in FIG. 22, a P-channel MOS-GTO having a cross-section shown in FIG. 23, an N-channel MOS-GTO having a cross-section shown in FIG. 24, a MOS thyristor having a cross-section shown in FIG. 25, or a MOS thyristor with a turn-off gate having a cross-section shown in FIG. 26.

In FIGS. 21 to 26, parts which correspond to those in FIG. 1 are denoted by the same reference numerals and the explanation thereof is omitted.

Figure 21:
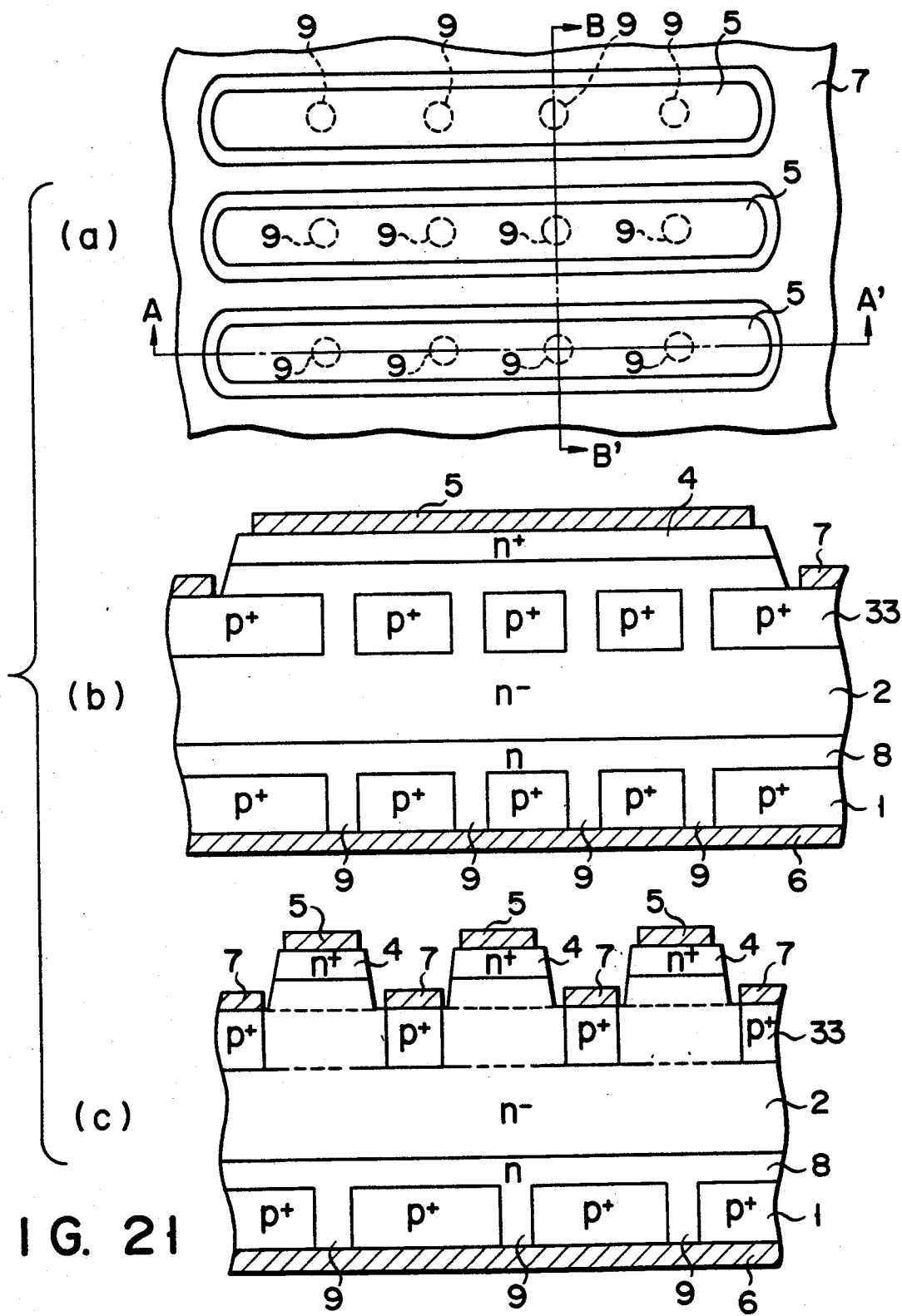

FIG. 21 shows a configuration of an SI thyristor to which an anode shorting structure of this invention is applied. In FIGS. 21(b) and (c), the reference numeral 33 denotes a p+ gate layer of the SI thyristor. FIG. 21(a) is a plane view from the cathode side, FIG. 21(b) is a cross-section taken along line A—A' in FIG. 21(a), and FIG. 21(c) is a cross-section taken along line B—B' in FIG. 21(a). A general configuration and its operation of the SI thyristor are well known, and the description therefor will be omitted. The high-speed with low loss switching feature of this invention can, of course, be obtained using the SI thyristor structure.

Incidentally, the present invention can be applied to an SI thyristor disclosed in the following document:

IEEE TRANSACTIONS OF ELECTRONS DEVICES. VOL. ED 33 NO. 1 JANUARY 1986.

A 2.5-kV Static Induction Thyristor Having New Gate and Shorted p-Emitter Structures (cf. FIG. 1)

Yoshio TERASAWA, Akio MIMURA, and Kenji MIYATA

Figure 22:
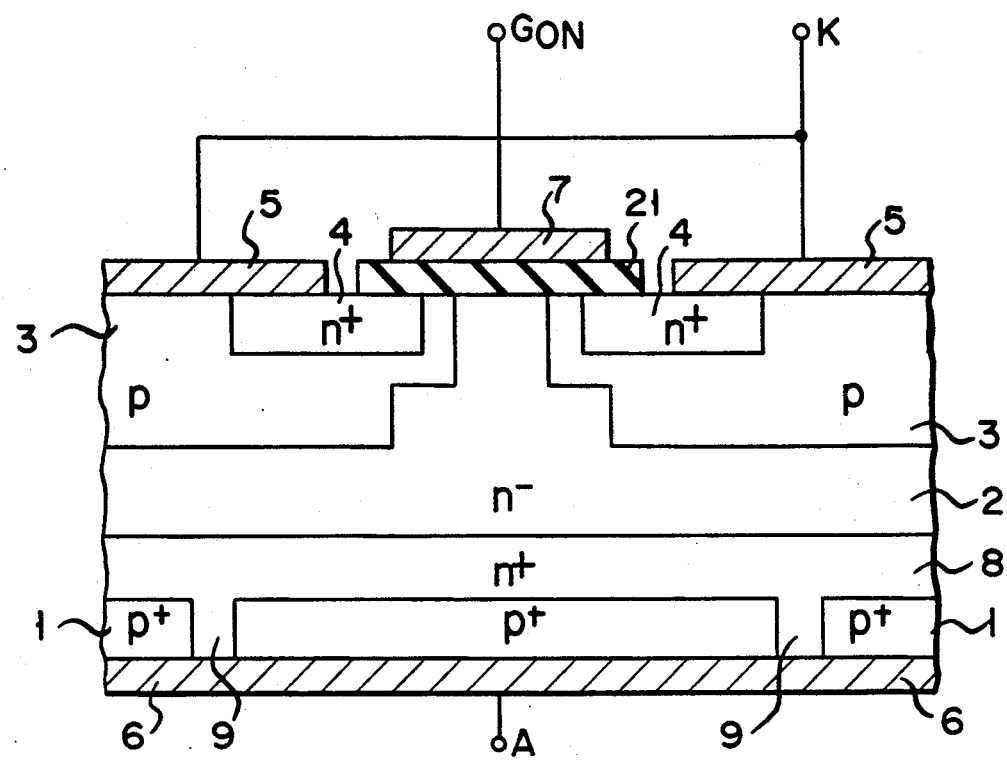

In the BI-FET of FIG. 22, gate electrode 7 is formed on gate oxide film 21. The construction can be replaced by that disclosed in the following document:

1800 V Bipolar-Mode MOSFETs: a first application of Silicon Wafer Direct Bonding (SDB) technique to a power device (cf. FIGS. 3 and 6)

Akio NAKAGAWA, Kiminori WATANABE, Yoshihiro YAMAGUCHI Hiromichi OHASHI, and Kazuyoshi FURUKAWA Toshiba Research and Development Center 1 Komukai Toshiba-cho, Saiwaiku, Kawasaki, 210

PROCEEDINGS OF THE INTERNATIONAL ELECTRON DEVICES MEETING. Los Angeles. Calif. Dec. 7-10, 1986

Figure 23:
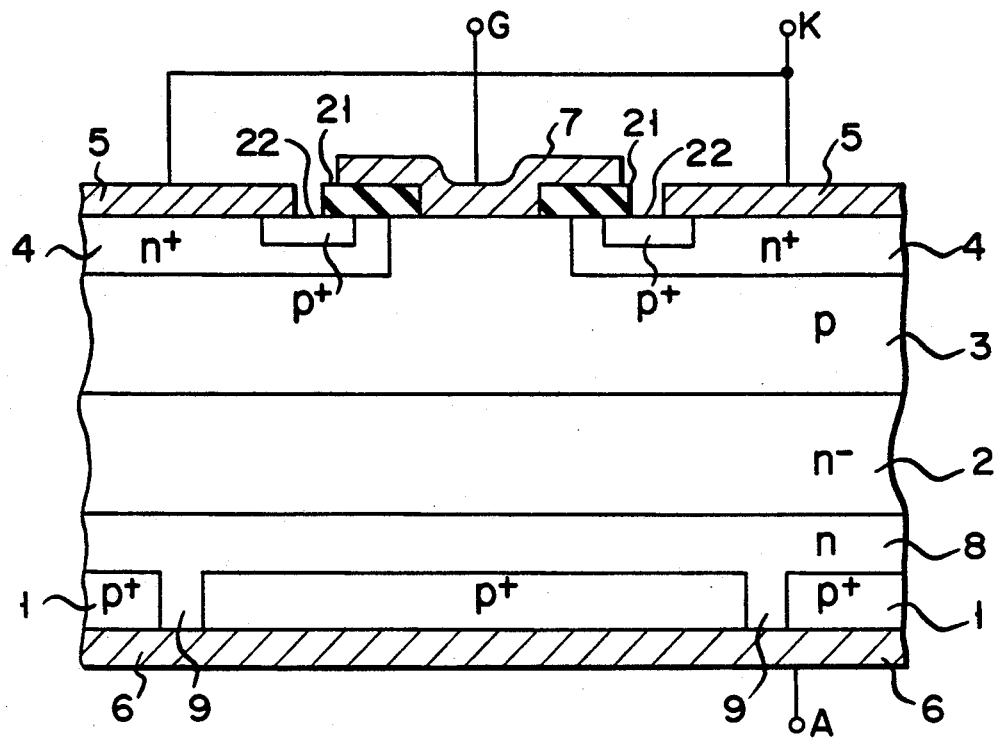

In the MOS-GTO of FIG. 23, p+-type layer 22 serving as a drain of the P-channel MOS transistor is formed in n+-type emitter layer 4. Further, insulation layer 21 is formed to partly cover layers 4 and 22. The construction can be replaced by that disclosed in the following document:

MOS GTO - A TURN OFF THYRISTOR WITH MOS-CONTROLLED EMITTER SHORTS (cf. FIGS. 1(a) and 1(b))

M. Stoisiek and H. Strack
SIEMENS AG, Munich FRG
IEDM 85

Figure 24:
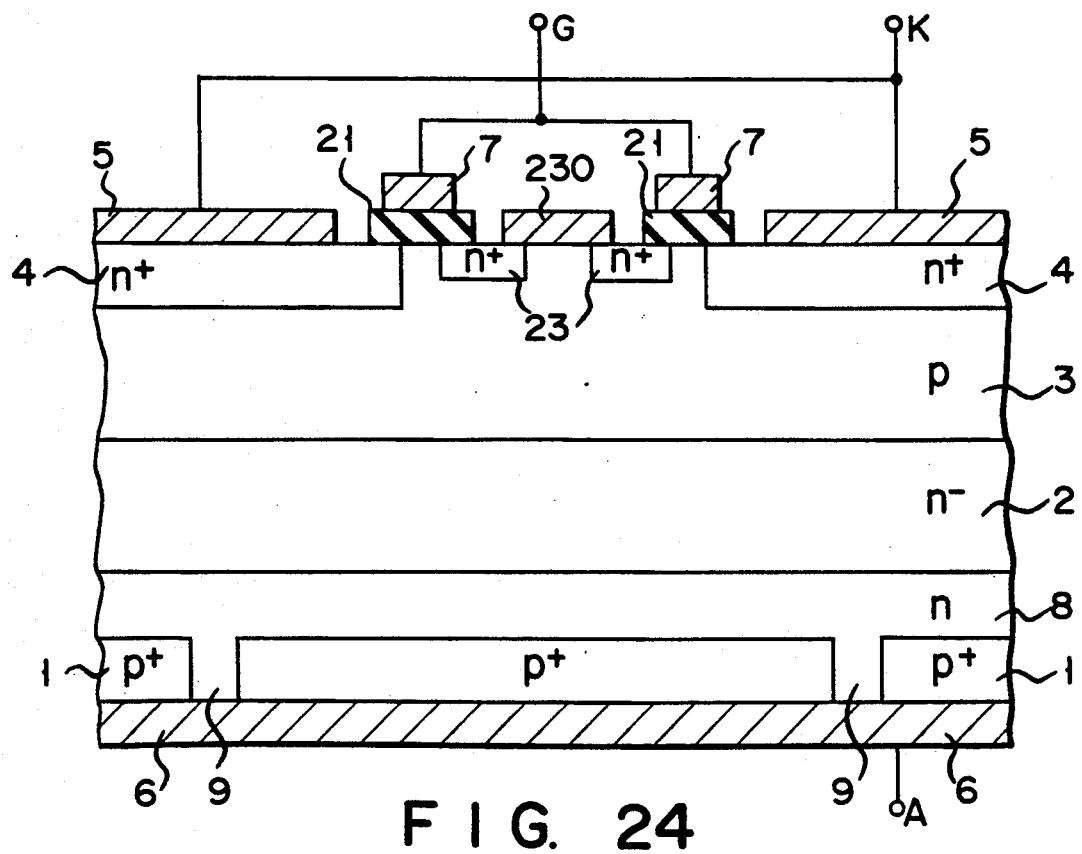

In the MOS-GTO of FIG. 24, n+-type layer 23 serving as a drain of the N-channel MOS transistor is formed in p-type base layer 3. In this case, n+-type layer 23 is connected to p-type layer 3 via aluminum layer 230. When a positive bias voltage is applied to gate electrode 7, a channel is formed between n+-type layers 4 and 23, thus creating a current path of n−-type layer 2→p-type layer 3→aluminum layer 230→n+-type layer 23→channel→n+-type layer 4. A current flowing through the current path may cause a thyristor formed of layers 1, 8, 2, 3 and 4 to be turned off. The construction of FIG. 24 can be replaced by that disclosed in the above document (Stoisiek et al.).

Figure 25:
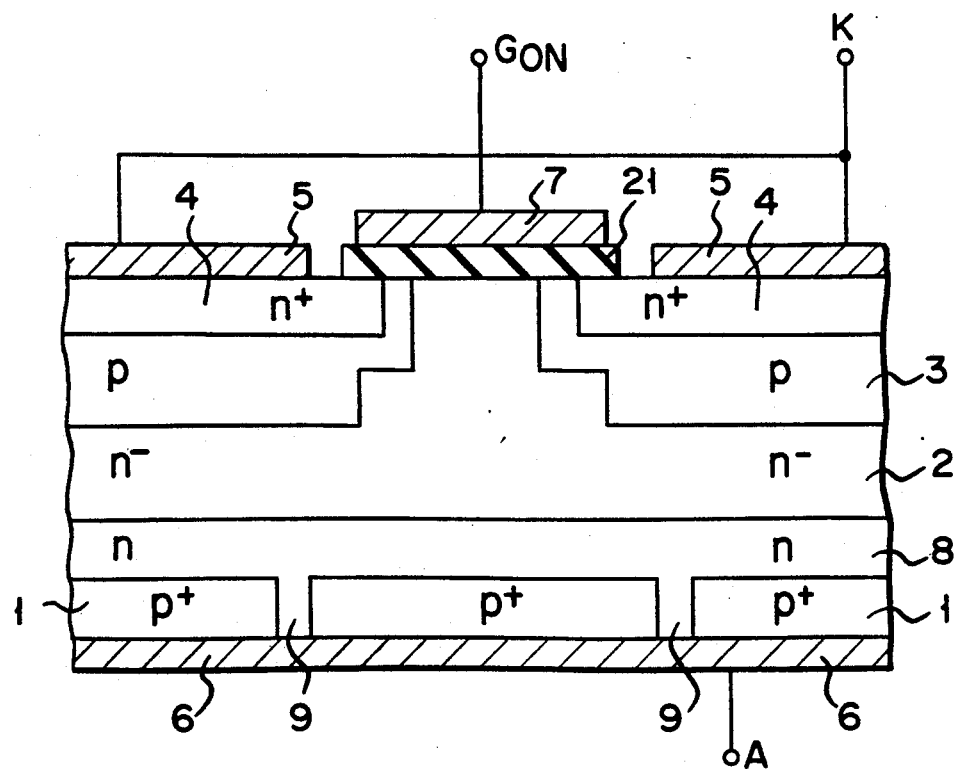

In the MOS thyristor of FIG. 25, gate electrode 7 is formed on gate insulation film 21. The construction can be replaced by that disclosed in the following document:

FET CONTROLLED THYRISTOR IN SIPMOS TECHNOLOGY (cf. FIG. 3)

L. Leipold, W. Raumgartner, W. Ladenhauf, J. P. Stengl

Siemens AC, Componets Division Munich, Germany
IEEE 1980

Figure 26:
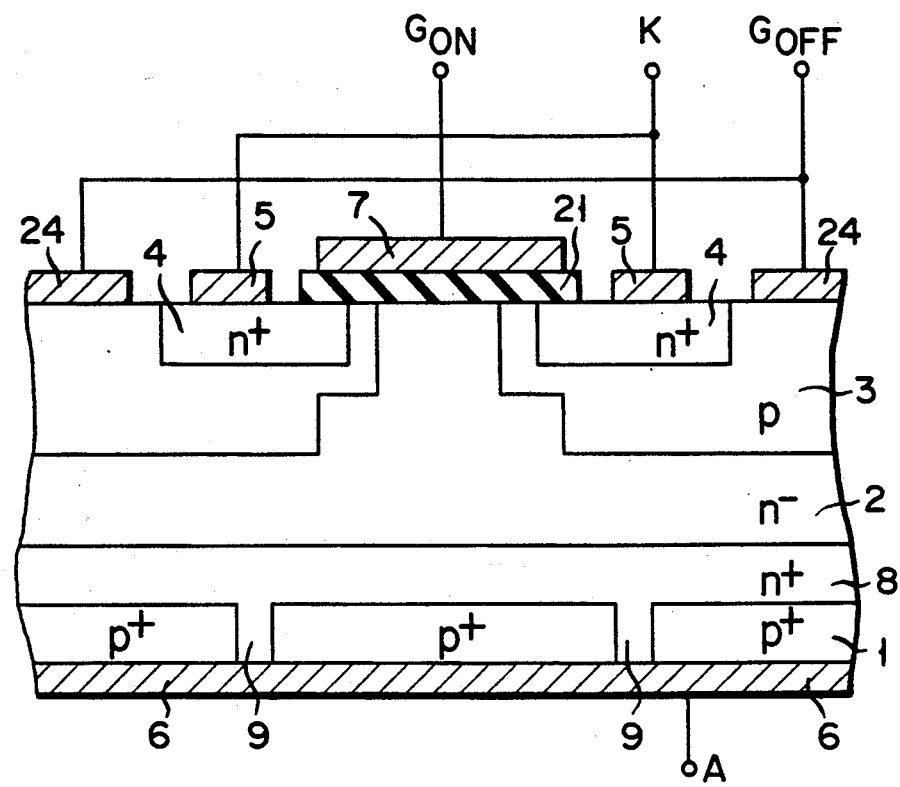

In the MOS thyristor with an off-gate of FIG. 26, turn-off gate electrode 24 is formed on p-type base layer 3. The construction can be replaced by that disclosed in the following document:

U.S. Pat. No. 4,604,638 (Matsuda) issued on Aug. 5, 1986 (cf. FIGS. 5 to 13)

It has been found that the property of the p+-type emitter layer is dependent not on the impurity profile thereof but on the total amount of charges. For this reason, in the device of each embodiment described above, p+-type emitter 1 is formed by ion-implantation of boron in order to keep the high injection efficiency at the junction between p+-type emitter layer 1 and n+-type buffer layer 8. The ion-implantation may be effected under the condition that the dose amount of boron is $1 \times 10^{15}$ to $1 \times 10^{16}/cm^2$ and the acceleration voltage is set at 30 KeV to 200 KeV.

Further, in the prior art, a Mo plate or W plate is alloyed onto a silicon pellet as a heat buffering plate. However, in this invention, p+-type emitter layer 1 is formed with thickness of less than 30 μm, and anode electrode 6 is formed by sintering an aluminum layer and is pressure-bonded to an external electrode.

Figure 27:
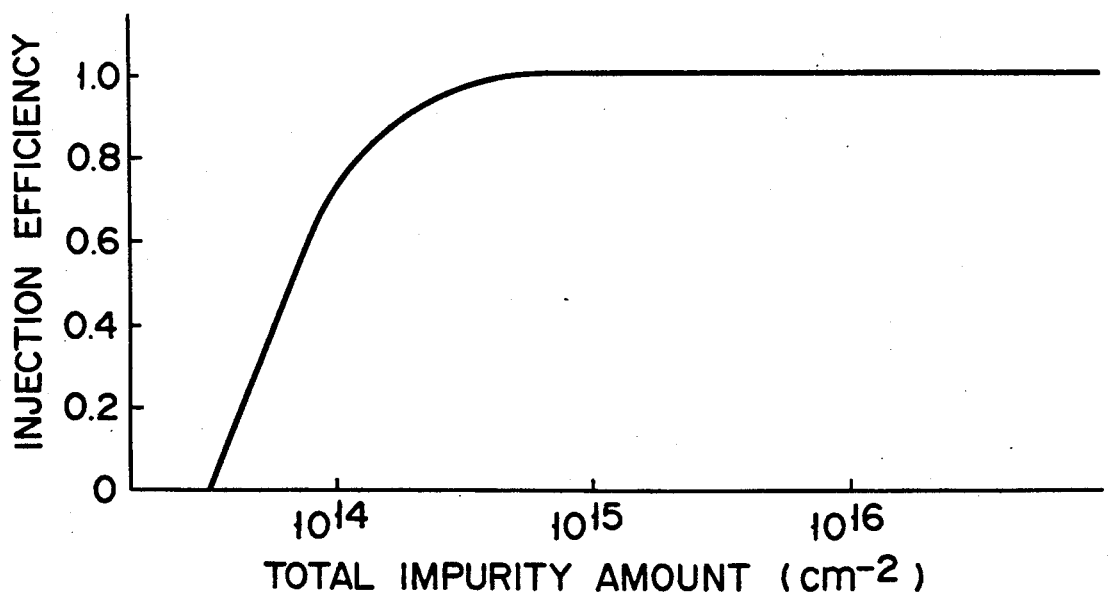
Figure 34D:
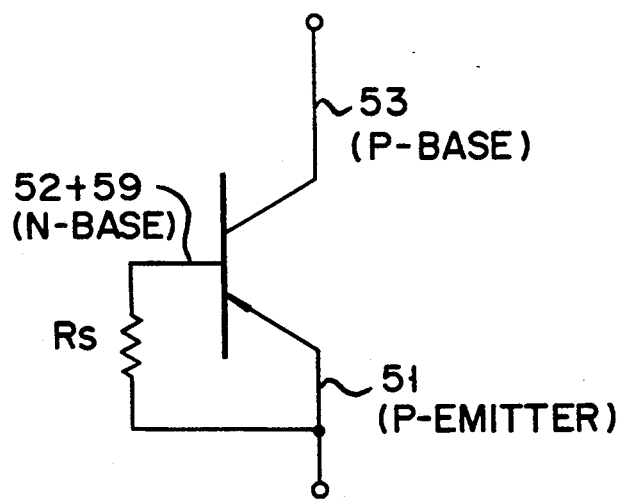
FIG. 34(d) is an equivalent circuit of a pnp transistor structure in the GTO having anode shorting structure.

FIG. 27 is a characteristic diagram showing the relation between the total impurity amount ($cm^{-2}$) of p+-type emitter layer 1 and the injection efficiency at the junction between p+-type emitter layer 1 and n+-type buffer layer 8. As can be seen from FIG. 27, the injection efficiency can be set near unity when the total impurity amount of p+-type emitter layer 1 is set higher than approx. $10^{15}$ (cm$^{-2}$).

FIG. 28 is a characteristic diagram showing the relation between the total impurity amount (cm$^{-2}$) of n+-type buffer layer 8 and the injection efficiency at the junction between p+-type emitter layer 1 and n+-type buffer layer 8. As can be seen from FIG. 28, the injection efficiency can be set near unity when the total impurity amount of n+-type buffer layer 8 is set lower than approx. $10^{14}$ (cm$^{-2}$). In this case, the value of sheet resistance $\rho s$ of n+-type buffer layer 8 is approx. 200 ($\Omega/\square$). In this invention, it may be necessary to set the value of $\rho s$ larger than 40 $\Omega/\square$.

As described above, when p+-type emitter layer 1 is formed thin, n+-type buffer layer 8 can be formed by use of diffusion technique, enhancing the reliability and simplifying the manufacturing process. Since p+-type emitter layer 1 is formed thin, lateral spread or diffusion of shorting portions 9 occurring when they are formed by impurity diffusion can be suppressed. This makes it possible to precisely form the pattern of the anode shorting portion and attain the high gate sensitivity and low switching loss at the same time.

Since formation of p+-type emitter layer 1 can be effected after the base diffusion, the base diffusion step which takes the longest time in the diffusion steps for manufacturing various GTOs can be commonly used in the manufacturing processes for various types of GTOs, and the latter steps can be changed for obtaining desired final products. Thus, various types of devices can be efficiently manufactured. Further, the characteristics of the GTO can be selectively designed not only by controlling the life time of remaining carriers at the turn-off time but also by forming shorting patterns on the anode side if required after the base diffusion step. Therefore, GTO's having various characteristics can be formed.

As described above, in the gate turn-off thyristor or switching device of this invention, since the impurity concentration of the n+-type buffer layer is set to an optimum value according to the pattern of the anode shorting structure, it becomes possible to set both the trigger sensitivity and turn-off loss to optimum values.

Other embodiments according to the third object of the present invention will be described below.

In the description, although a GTO is used for the explanation, the described embodiments can readily be applied to the aforementioned SI thyristor, BI-FET, MOS GTO, MOS thyristor, etc.

Figure 29:
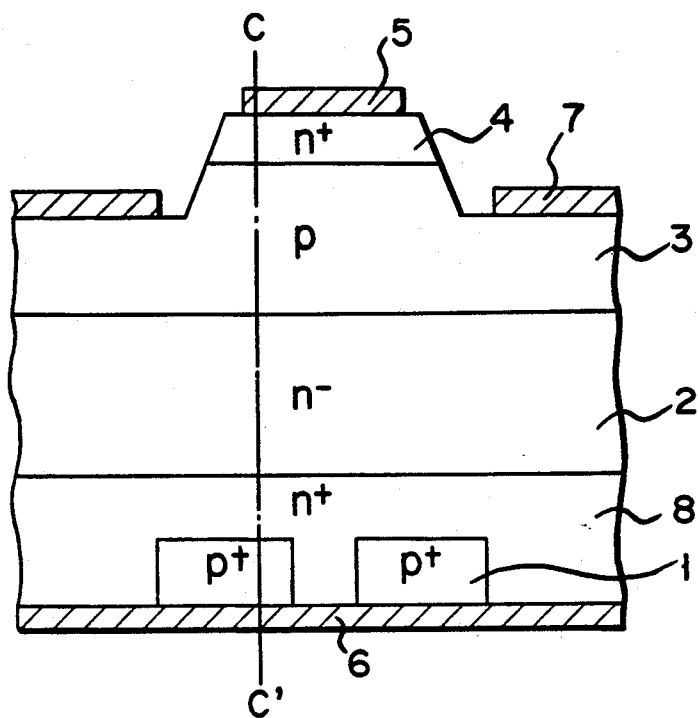
FIG. 29 is a cross-sectional view of a GTO according to another embodiment of this invention.

FIG. 29 is a cross-sectional view taken along the width direction of a GTO according to an embodiment of this invention, wherein the section in the longitudinal direction is the same as that in FIG. 34. The GTO includes anode electrode (first emitter electrode) 6, p+-type emitter layer (first emitter layer) 1, low resistance n+-type buffer layer 8, n-type base layer (first base layer) 2, p-type base layer (second base layer) 3, n+-type emitter layer (second emitter layer) 4, gate electrode 7 and cathode electrode (second emitter electrode) 5 which are formed in basically the same structure as those shown in FIG. 1.

Figure 30:
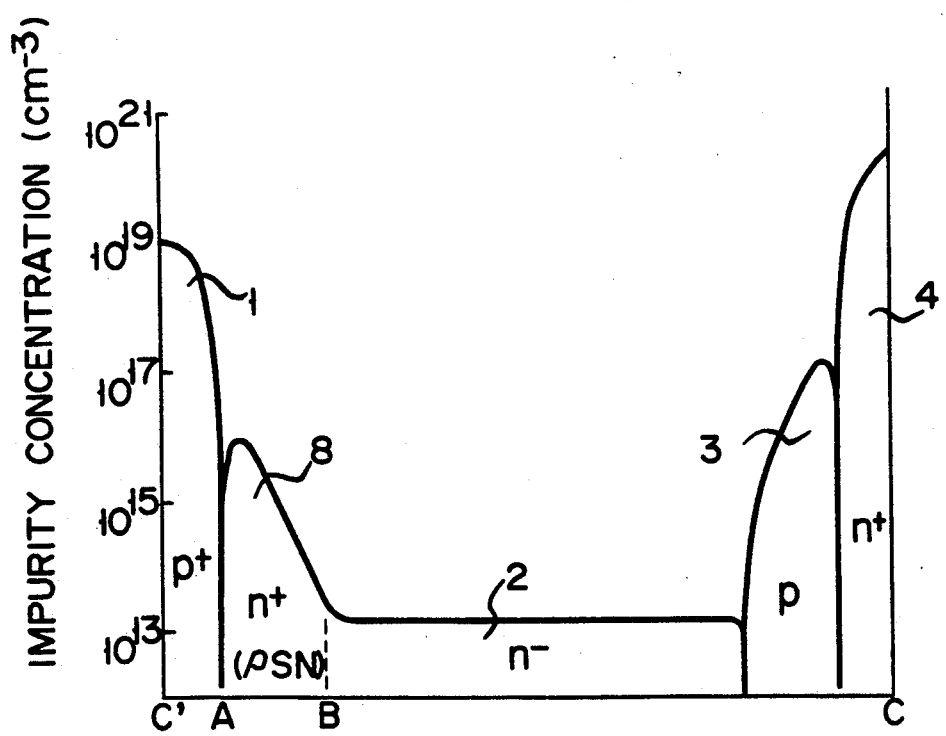
FIG. 30 is a diagram showing the distribution of the impurity concentration in the embodiment of FIG. 29.

FIG. 30 shows an impurity profile of the cross-section of FIG. 29 taken along line C—C'. In this embodiment, the impurity concentration of n+-type buffer layer 8 is set lower than in the prior art case, and sheet resistance $\rho$sN thereof is set in the range of 400 to 10000 ($\Omega/\square$). If an average resistivity of n+-type buffer layer is $\rho$ ($\Omega$.cm) and the thickness thereof is W (cm), then sheet resistance $\rho$sN can be expressed as follows:

$$\rho sN = \rho/W \qquad (11)$$

The sheet resistance can be easily obtained by use of a 4-probe method which is effected by selectively etching out p+-type emitter layer 1 from the anode (6) side of the GTO to expose part of n+-type buffer layer 8, and placing four probes in contact with the exposed surface of n+-type buffer layer 8.

Assume that the positional function in the depth direction (in the direction of C'→C in FIG. 29) of n+-type buffer layer 8 is x, the distribution of impurity concentration of n+-type buffer layer 8 is N(x), the mobility of electrons is $\mu(x)$ and the unit charge is q. Then, $\rho$sN in FIG. 30 can be expressed as follows [this is in the same form as Eq. (3)]:

$$\rho sN = 1 / \left[ q \int_A^B \mu(x) \cdot N(x) \cdot dx \right] \qquad (12)$$

where A and B are lower and upper limits defining the range of n+-type buffer layer 8 in the thickness direction.

There will now be described, based on experimental data, a reason why the sheet resistance of n+-type buffer layer 8 is set in the range as described above and an advantage attained by setting the sheet resistance in the range. The GTO used for the experiment is formed to have high resistance n-type base layer 2 in which $\rho = 300$ $\Omega$, the thickness is 400 $\mu$m and the diameter is 3.3 cm$\phi$.

Figure 31:
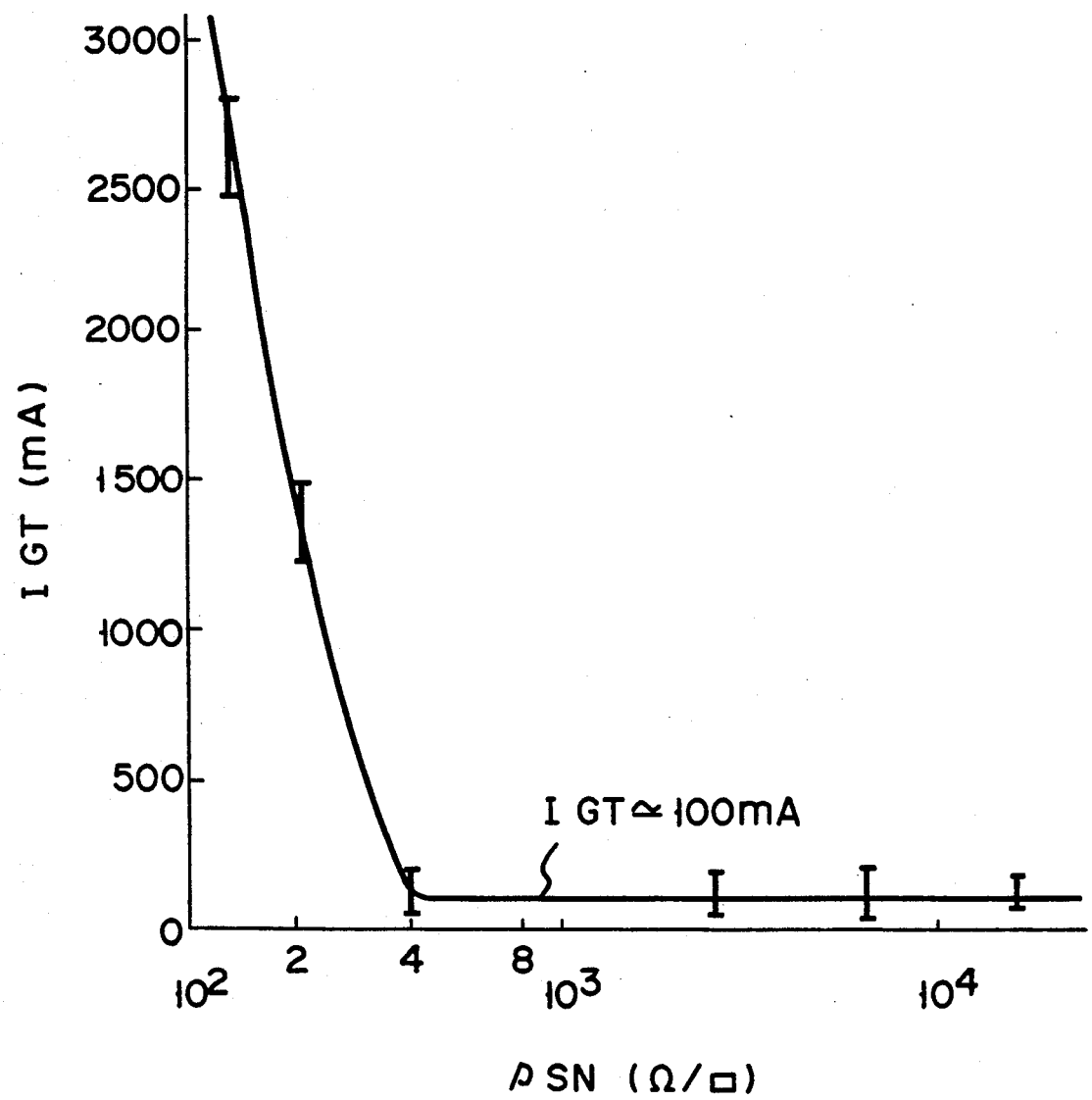
FIG. 31 shows a relation between the gate trigger sensitivity and the sheet resistance of the n+-type buffer layer.

FIG. 31, shows variation in gate trigger current $I_{GT}$ (a minimum current flowing between gate electrode 7 and cathode electrode 5 required to turn on the GTO) obtained when the impurity concentration of n+-type buffer layer 8 is varied to change sheet resistance $\rho$sN. The measurement data shows that gate trigger sensitivity $I_{GT}$ is kept at approx. 100 mA when sheet resistance $\rho$sN is larger than 400 $\Omega/\square$. In contrast, when sheet resistance $\rho$sN is smaller than 400 $\Omega/\square$, the gate trigger sensitivity is lowered to a great extent, thus making it necessary to use a gate circuit of a large current capacity in order to turn on the GTO.

Further, n+-type buffer layer 8 serves to suppress the extension of a depletion layer created when a forward bias voltage is applied to the GTO, thus increasing the breakdown voltage. However, the effect is lowered when the impurity concentration of buffer layer 8 is made low.

Figure 32:
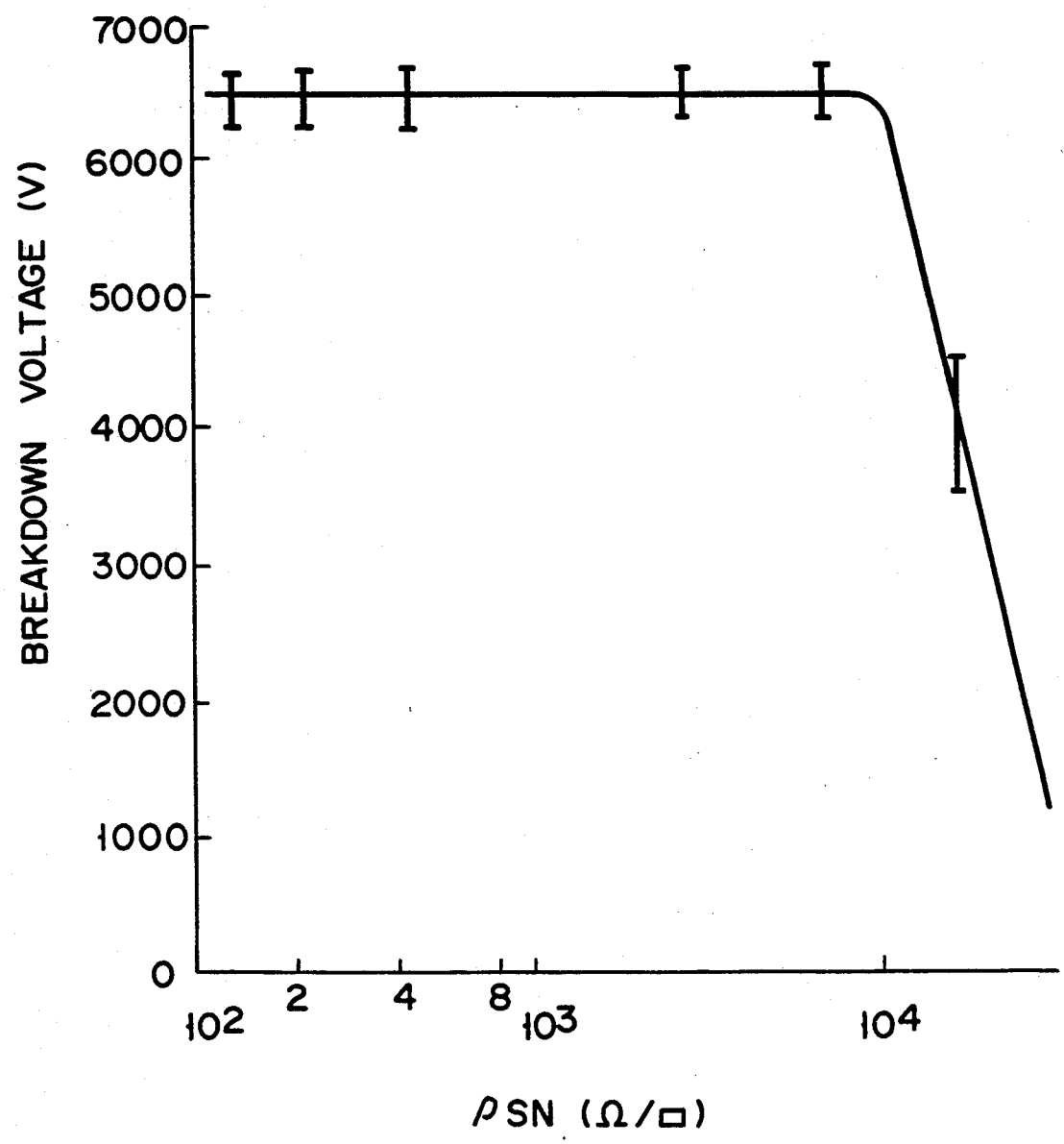
FIG. 32 shows a relation between the breakdown voltage and the sheet resistance of the n+-type buffer layer.

FIG. 32 shows the relation between sheet resistance $\rho$sN of n+-type buffer layer 8 and the breakdown voltage in the forward direction of the GTO. As seen from the measurement data, when sheet resistance $\rho$sN is lower than 10000 $\Omega/\square$, the lowering of the breakdown voltage can be prevented.

As described above, according to this invention, when the sheet resistance of the n+-type layer is set within a specified range (400 to 10000 $\Omega/\square$), the lowering of the gate triggering sensitivity and breakdown voltage can be prevented without placing shorting portions 9 in specified portions as shown in FIG. 1.

In the embodiments according to the first and second objects of the present invention as shown in, for example, FIGS. 1 to 3, in which shorting portions 9 are localized in positions with respect to n+-type emitter layer 4, even if the lower limit of sheet resistance $\rho sN$ is lowered down to 40 $\Omega/\square$, the gate triggering sensitivity can be prevented from being lowered. Therefore, in the embodiments of FIGS. 1 to 3, the sheet resistance of n+-type buffer layer 8 is preferably set in a range of 40 to 10000 $\Omega/\square$. FIG. 12 shows cases where sheet resistance $\rho sN$ is 228, 975 and $10^4$ $\Omega/\square$.

This invention has been described with reference to the embodiments, but it is not limited to these embodiments. This invention can also be applied to, for example, light-triggered GTOs which are turned on in response to a light signal.

As described above, according to this invention, it is possible to obtain a high-performance GTO in which both the gate trigger sensitivity and breakdown voltage can be set high by setting the sheet resistance of the n+-type buffer layer in a range lower than that of the prior art GTO.

Finally, the present invention is further described in the following document, the writers of which include the inventors of the present Patent Application.

6000 V Gate Turn-Off Thyristor (GTO) with N-Buffer and New Anode Short Structure Tsuneo OGURA, Mitsuhiko KITAGAWA, Hiromichi OHASHI and Akio NAKAGAWA Research and Development Center and Tamagawa Works, Toshiba Corp. 1 Komukai Toshiba-cho, Saiwai-ku, Kawasaki 210, Japan Extended Abstracts of the 19th Conference on Solid State Devices and Materials, Tokyo, 1987, pp. 63–66

Aug. 25-27, 1987, Nippon Toshi Center, Tokyo, Japan

THE JAPAN SOCIETY OF APPLIED PHYSICS

All disclosures of the above documents are incorporated in the present Patent Application.

What is claimed is:

1. A semiconductor switching device comprising:
a first emitter layer of a first conductivity type;
a high resistance first base layer of a second conductivity type formed on said first emitter layer through a low resistance buffer layer of the second conductivity type;
a second base layer of the first conductivity type formed on said first base layer;
a second emitter layer of the second conductivity type formed on said second base layer;
first and second main electrodes formed in contact with said first and second emitter layers, respectively;
a gate electrode formed in contact with said second base layer; and
a shorting portion being formed of part of said low resistance buffer layer which extends to be exposed to a surface of said first emitter layer and contacts said first main electrode, said shorting portion being localized in a limited area with respect to a longitudinal direction of said second emitter layer, with a ratio of the area of said shorting portion to the area of said second emitter layer being sufficient to provide an anode shorting ratio substantially less than 10%.

2. A gate turn-off thyristor device comprising:
a pnpn structure formed of a first emitter layer of a first conductivity type, a high resistance first base layer of a second conductivity type formed on said first emitter layer through a low resistance buffer layer of the second conductivity type with said low resistance buffer layer surrounding said first emitter layer, a second base layer of the first conductivity type formed on said first base layer and a second emitter layer of the second conductivity type formed on said second base layer;
a first emitter electrode formed to electrically connect said first emitter layer to said buffer layer;
a second emitter electrode formed on said second emitter layer; and
a gate electrode formed on said second base layer;
wherein sheet resistance $\rho sN$ ($\Omega/\square$) of said low resistivity buffer layer is set to satisfy the following relation:

$$400 \leq \rho sN \leq 10000.$$

3. A semiconductor switching device comprising:
a first emitter layer of a first conductivity type;
a high resistance first base layer of a second conductivity type formed on said first emitter layer through a low resistance buffer layer of the second conductivity type with said low resistance buffer layer surrounding said first emitter layer;
a second base layer of the first conductivity type formed on said first base layer;
a second emitter layer of the second conductivity type formed on said second base layer;
first and second main electrodes formed in contact with said first and second emitter layers, respectively;
a gate electrode formed in contact with said second base layer; and
a plurality of shorting portions formed of part of said low resistance buffer layer and extending to be exposed to a surface of said first emitter layer and contacting said first main electrode, said shorting portions being provided in a longitudinal direction of said second emitter layer with a distance between each center portion of two of said shorting portions being twice the distance from a center portion of at least one said shorting portion to an end of a longitudinal portion of said second emitter layer, and with a ratio of the area of said shorting portions to the area of said second emitter layer being sufficient to provide an anode shorting ratio substantially less than 10%.

4. A semiconductor switching device comprising:
a first emitter layer of a first conductivity type, including a low resistance layer with a high impurity concentration of the first conductivity type and a high resistance layer with a low impurity concentration of the first conductivity type formed to surround said low resistance layer;
a high resistance first base layer of a second conductivity type formed on said first emitter layer through a low resistance buffer layer of the second conductivity type;
a second base layer of the first conductivity type formed on said first base layer;
a second emitter layer of the second conductivity type formed on said second base layer;
first and second main electrodes formed in contact with said first and second emitter layers, respectively;
a gate electrode formed in contact with said second base layer; and
shorting portions each having a length in the longitudinal direction of said second emitter layer smaller than one-tenth of a longitudinal length of said second emitter layer and being formed of part of said low resistance buffer layer which extend to be exposed to the surface of said first emitter layer and contact said first main electrode, wherein a sheet resistance ps ($\Omega/\square$) of said low resistance buffer layer is determined as follows:

ps = K(1/d²)

where d is a distance (cm) between shorting portions and K is a proportional constant.

5. A semiconductor switching device comprising:
a first emitter layer of a first conductivity type, including a low resistance layer with a high impurity concentration of the first conductivity type and a high resistance layer with a low impurity concentration of the first conductivity type formed to surround said low resistance layer;
a high resistance first base layer of a second conductivity type formed on said first emitter layer through a low resistance buffer layer of the second conductivity type;
a second base layer of the first conductivity type formed on said first base layer;
a second emitter layer of the second conductivity type formed on said second base layer;
first and second main electrodes formed in contact with said first and second emitter layers, respectively;
a gate electrode formed in contact with said second base layer; and
shorting portions being formed along a path corresponding to a direction of a longitudinal portion of said second emitter layer, and a distance between each center portion of two of said shorting portions being twice the distance from a center portion of at least one said shorting portion to an end of said longitudinal portion of said second emitter layer, said shorting portions being formed of part of said low resistance buffer layer which extend to be exposed to the surface of said first emitter layer and contact said first main electrode, wherein a sheet resistance ps ($\Omega/\square$) of said low resistance buffer layer is determined as follows:

ps = K(1/d²)

where d is a distance (cm) between shorting portions and K is a proportional constant.

6. A device according to claim 4 or 5, wherein said shorting portions are localized in a limited area with respect to a longitudinal direction of said second emitter layer.

7. A device according to claim 4, wherein a plurality of said shorting portions are formed along a path corresponding to a direction of a longitudinal portion of said second emitter layer, and a distance between each center portion of two of said shorting portion is twice the distance from a center portion of at least one said shorting portion to an end of said longitudinal portion of said second emitter layer.

8. A device according to claim 4 or 5, wherein K is set to satisfy the following representation:

$0.01 \leq K \leq 10^6$.

9. A device according to claim 4 or 5, wherein K is set to satisfy the following representation:

$0.2 \leq K \leq 10^6$.

10. A device according to claim 4 or 5, wherein K is set to satisfy the following representation:

$0.2 \leq K \leq 10^4$.

11. A device according to claims 4 or 5, wherein said shorting portions are provided along the longitudinal direction of said second emitter layer.

12. A device according to claim 4 or 5, wherein the impurity concentration of said high resistance layer of said first emitter layer is set lower than one-half that of said low resistance layer.

13. A device according to claim 4 or 5, wherein said first emitter layer has a thickness of less than 30 μm.

14. A device according to claim 13, wherein said first main electrode is formed of a sintered aluminum layer on said first emitter layer.

15. A device according to claim 4 or 5, comprising gate turn-off means which includes a main gate turn-off section and an amplifying gate section.

16. A device according to claim 15, wherein a shorting portion is formed in said first emitter layer in an area onto which said amplifying gate section is projected.

17. A device according to claim 4 or 5, wherein said second emitter layer includes a plurality of emitter regions and said first emitter layer is divided by an isolating section into plural portions corresponding in number to the number of said emitter regions of said second emitter layer and which further comprises an insulation layer formed between said first main electrode and said isolating section formed in contact with said low resistance buffer layer.

18. A device according to claim 4 or 5, wherein said shorting portion is formed directly under at least one of said second emitter layer and said gate electrode.

19. A device according to claim 1, 4 or 5, further comprising a structure of an amplifying gate.

20. A device according to claim 1, 4 or 5, further comprising a structure of a static induction thyristor.

21. A device according to claim 4 or 5, comprising gate turn-off means which includes a main gate turn-off section and an amplifying gate section, and wherein the value of K for said amplifying gate section is smaller than that for said main gate turn-off section.

* * * * *